(12) United States Patent
Fujio et al.

(10) Patent No.: US 6,724,035 B2
(45) Date of Patent: Apr. 20, 2004

(54) SEMICONDUCTOR MEMORY WITH SOURCE/DRAIN REGIONS ON WALLS OF GROOVES

(75) Inventors: Masuoka Fujio, Sendai (JP); Takuji Tanigami, Fukuyama (JP); Yoshihisa Wada, Fukayasu-gun (JP); Kenichi Tanaka, Fukuyama (JP); Hiroaki Shimizu, Shiki-gun (JP)

(73) Assignees: Sharp Kabushiki Kaisha, Osaka (JP); Fujio Masuoka, Sendai (JP)

( * ) Notice: Subject to any disclaimer, the term of this patent is extended or adjusted under 35 U.S.C. 154(b) by 0 days.

(21) Appl. No.: 09/733,031

(22) Filed: Dec. 11, 2000

(65) Prior Publication Data

US 2002/0036316 A1 Mar. 28, 2002

(30) Foreign Application Priority Data

Dec. 10, 1999 (JP) ............................................. 11-352054

(51) Int. Cl.⁷ ......................... H01L 27/108; H01L 29/76
(52) U.S. Cl. ....................... 257/314; 257/301; 257/315; 257/318; 257/330
(58) Field of Search ........................ 257/301, 314–316, 257/318, 330

(56) References Cited

U.S. PATENT DOCUMENTS

| | | | | | |
|---|---|---|---|---|---|
| 5,932,909 A | * | 8/1999 | Kato et al. | .................. | 257/316 |
| 5,990,515 A | * | 11/1999 | Liu et al. | ..................... | 257/316 |
| 6,002,151 A | * | 12/1999 | Liu et al. | ..................... | 257/314 |
| RE37,311 E | * | 8/2001 | Kato et al. | ............. | 365/185.27 |
| 6,362,504 B1 | * | 3/2002 | Simpson | ..................... | 257/317 |
| 6,363,504 B1 | * | 3/2002 | Rhodes et al. | .......... | 324/158.1 |

FOREIGN PATENT DOCUMENTS

JP          4-137558          5/1992

* cited by examiner

Primary Examiner—Allan R. Wilson
Assistant Examiner—Matthew E. Warren
(74) Attorney, Agent, or Firm—Nixon & Vanderhye P.C.

(57) ABSTRACT

A process for producing a semiconductor memory device comprises the steps of: (a) forming a floating gate on a semiconductor substrate having a dielectric film; (b) forming a side wall spacer comprising an insulating film on a side wall of the floating gate; (c) forming a groove by etching the semiconductor substrate using the side wall spacer as a mask; and (d) forming a low concentration impurity layer from one side wall to a bottom surface of the groove by an oblique ion implantation to the semiconductor substrate thus resulting, and forming a high concentration impurity layer from the other side wall to the bottom surface of the groove by in inverse oblique ion implantation.

14 Claims, 18 Drawing Sheets

Fig. 2(a)
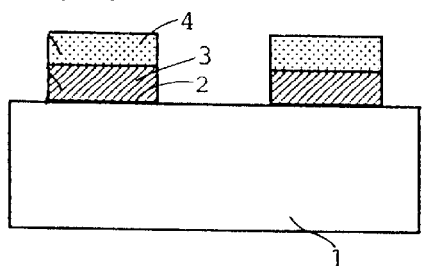
Fig. 2(a')
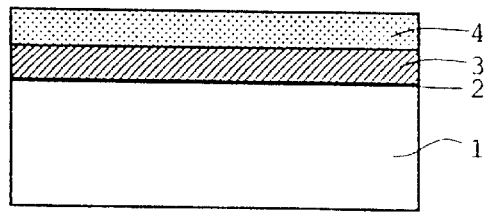
Fig. 2(b)
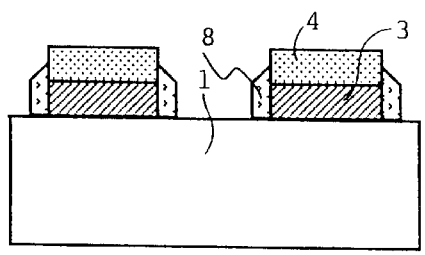
Fig. 2(b')
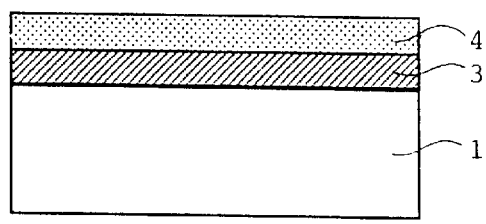
Fig. 2(c)
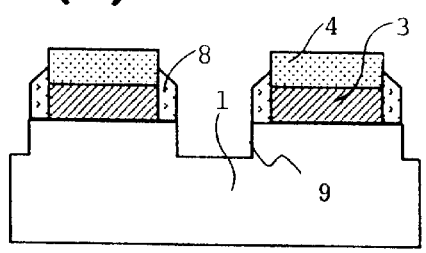
Fig. 2(c')
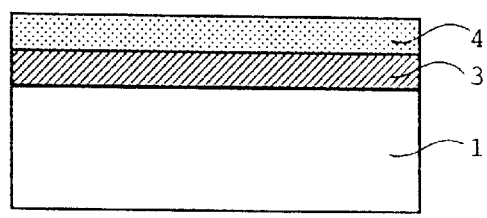
Fig. 2(d)
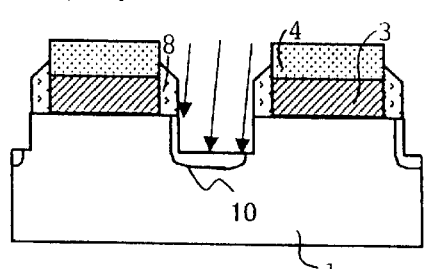
Fig. 2(d')
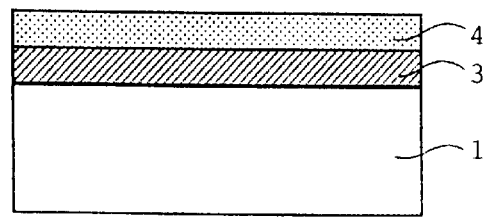
Fig. 2(e)
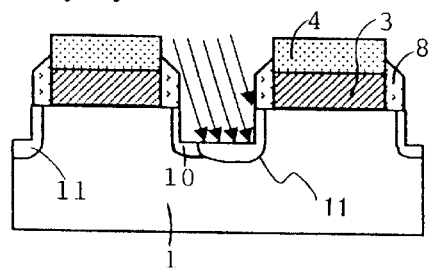
Fig. 2(e')
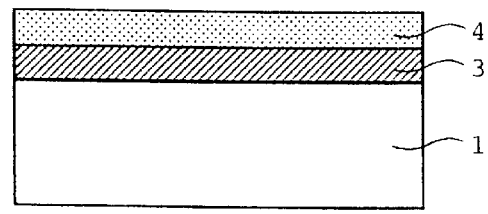

Fig. 3(f') 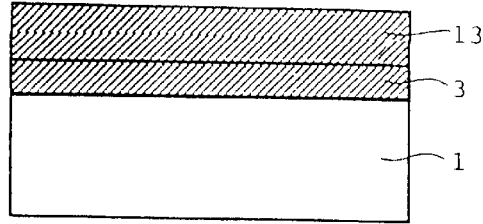

Fig. 3(g') 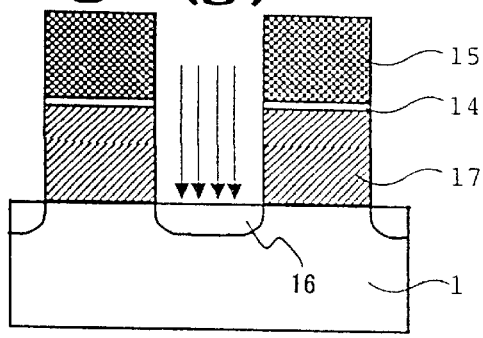

Fig. 4(a)
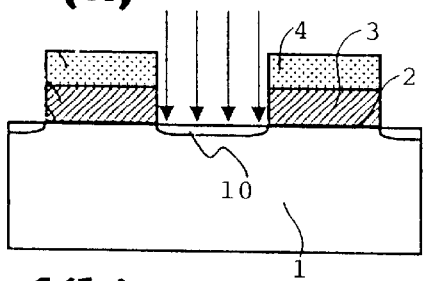
Fig. 4(a')
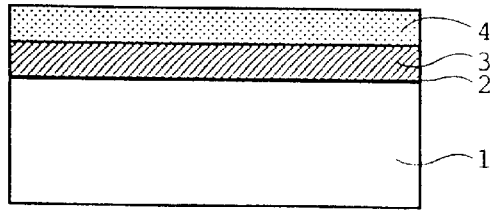
Fig. 4(b)
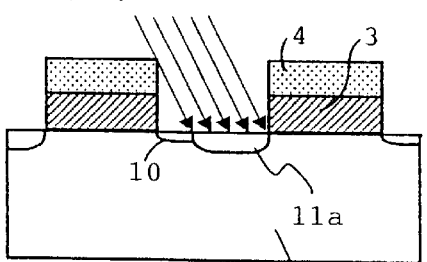
Fig. 4(b')
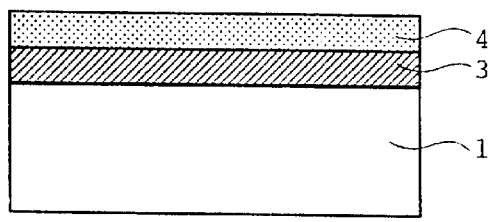
Fig. 4(c)
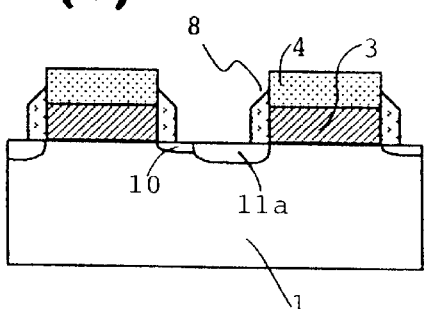
Fig. 4(c')
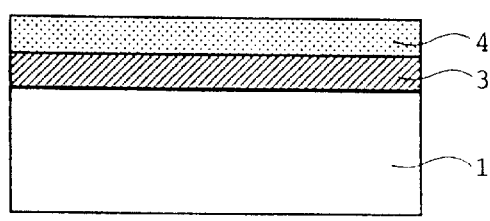
Fig. 4(d)
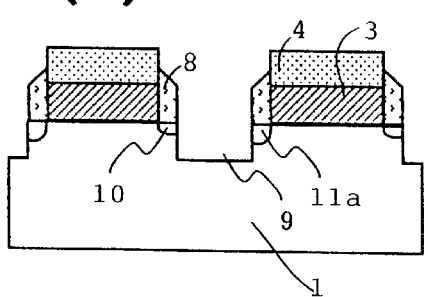
Fig. 4(d')
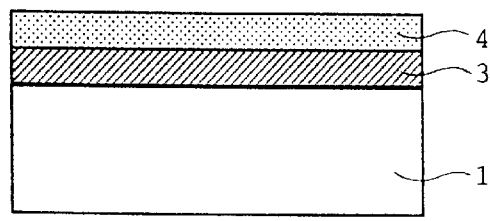
Fig. 4(e)
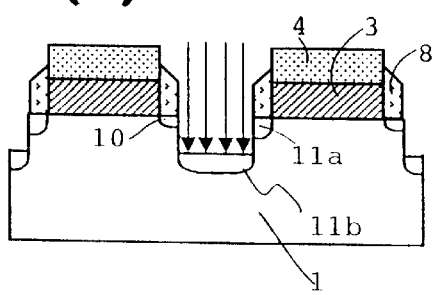
Fig. 4(e')
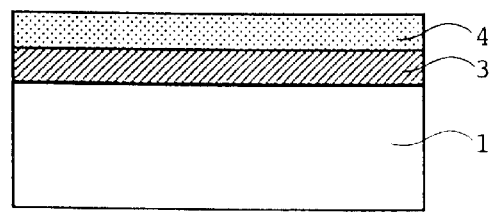

Fig. 5(f)
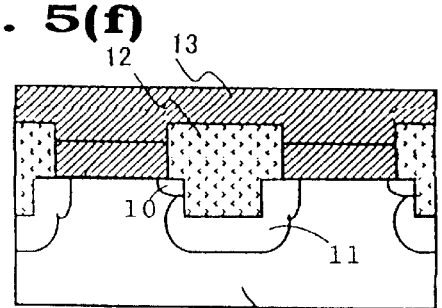
Fig. 5(f')
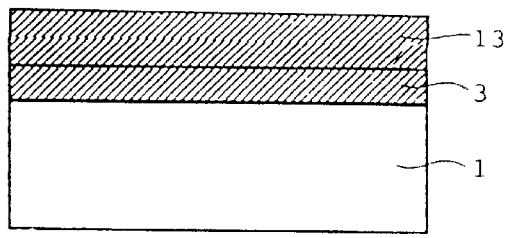
Fig. 5(g)
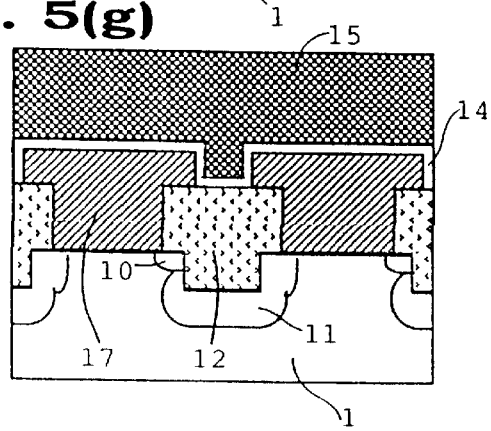
Fig. 5(g')
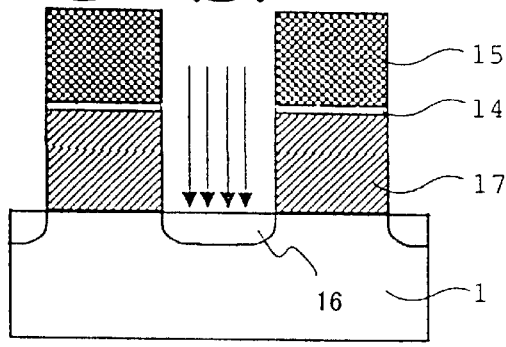

Fig. 6(a)
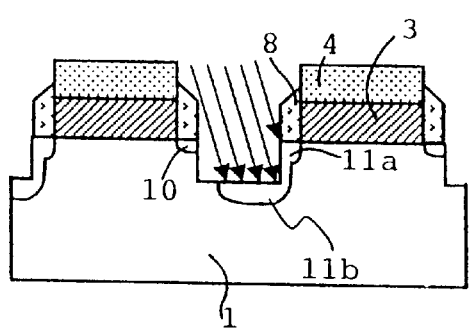
Fig. 6(a')
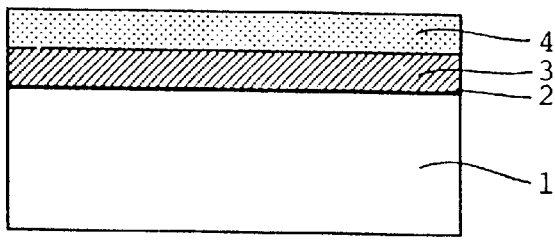
Fig. 6(b)
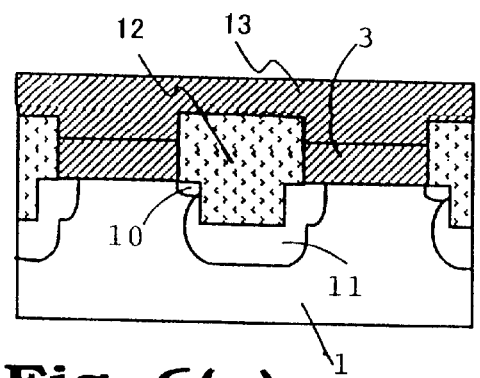
Fig. 6(b')
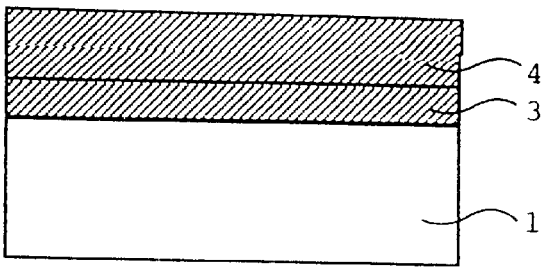
Fig. 6(c)
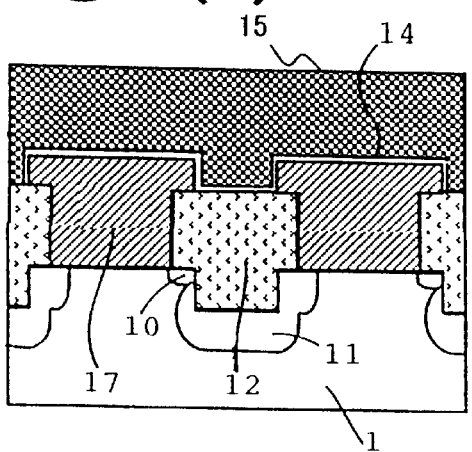
Fig. 6(c')
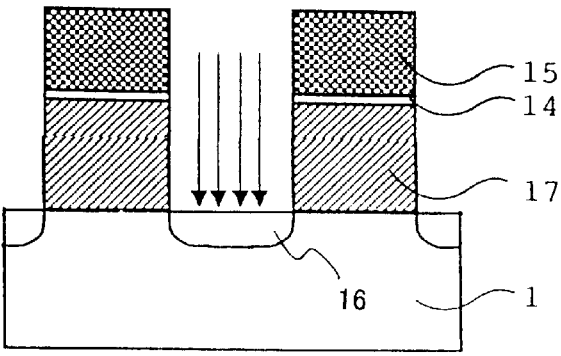

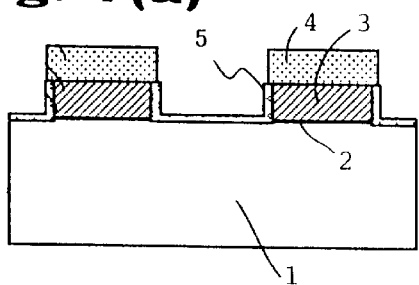
Fig. 7(a)
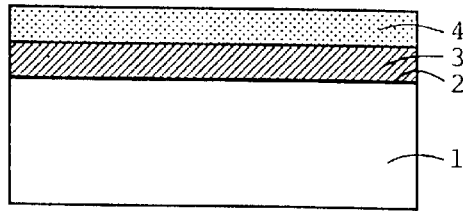
Fig. 7(a')
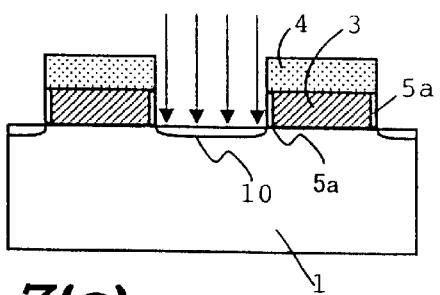
Fig. 7(b)
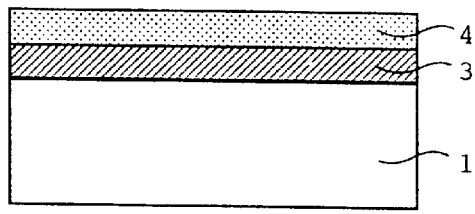
Fig. 7(b')
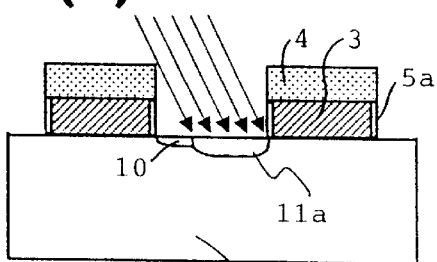
Fig. 7(c)
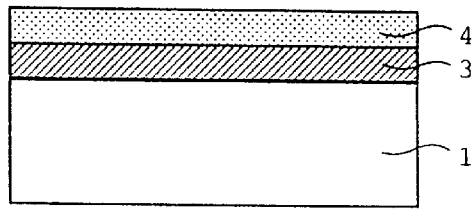
Fig. 7(c')
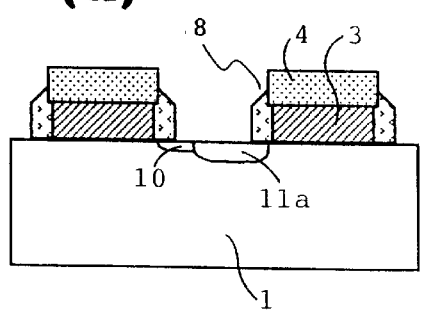
Fig. 7(d)
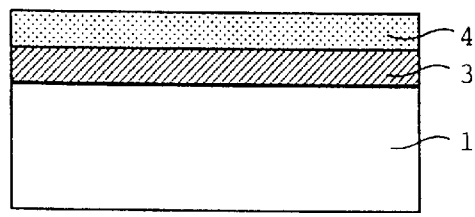
Fig. 7(d')
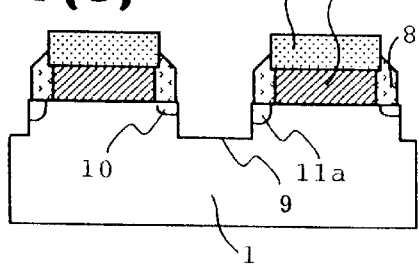
Fig. 7(e)
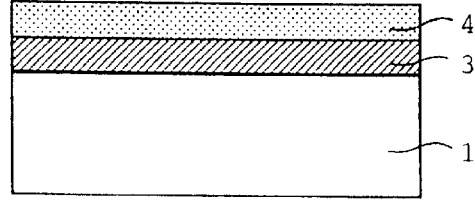
Fig. 7(e')

Fig. 8(f)
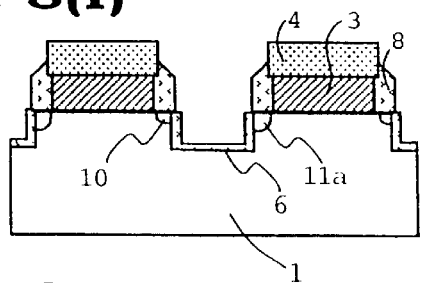
Fig. 8(f')
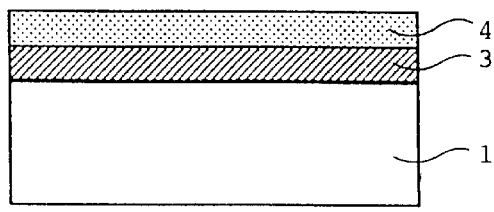
Fig. 8(g)
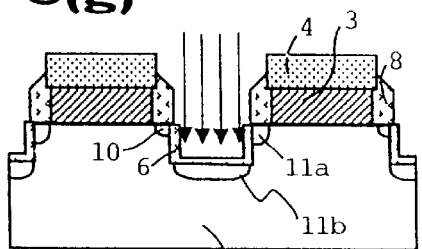
Fig. 8(g')
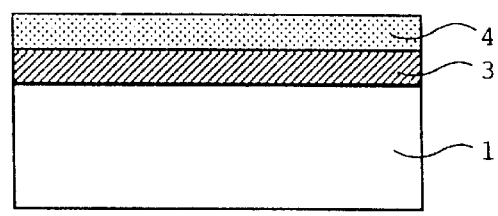
Fig. 8(h)
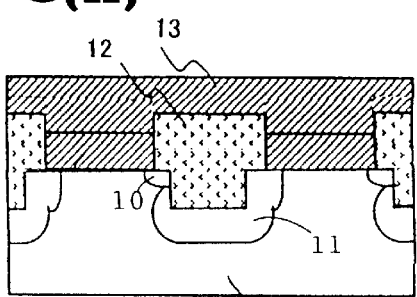
Fig. 8(h')
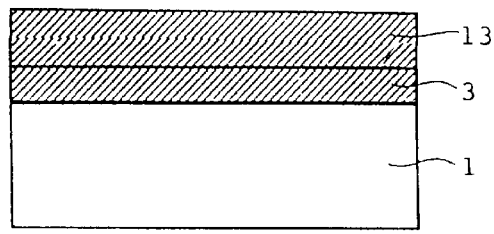
Fig. 8(i)
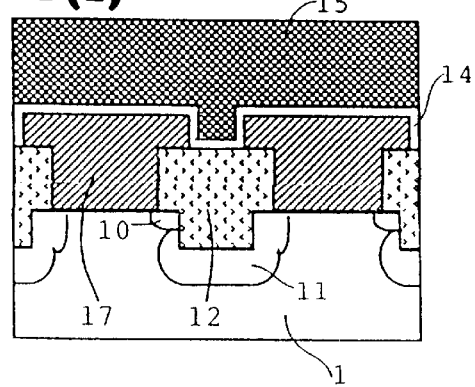
Fig. 8(i')
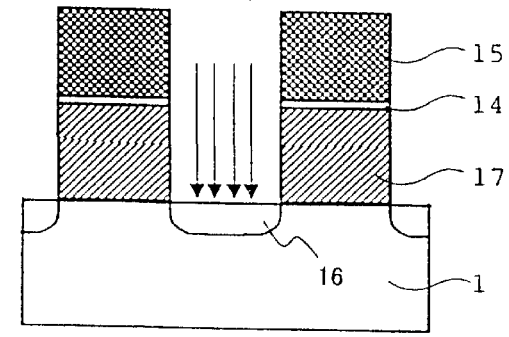

Fig. 9(a)
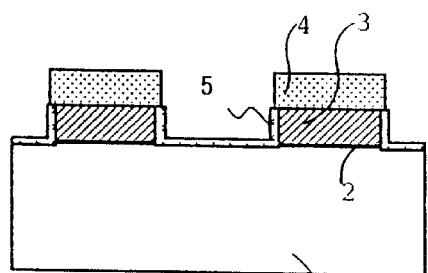
Fig. 9(a')
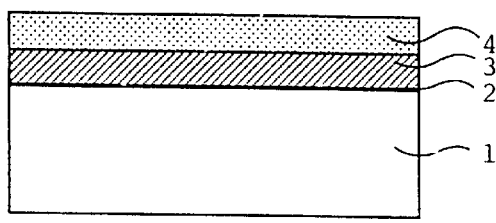
Fig. 9(b)
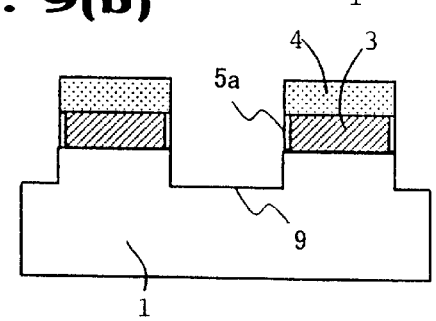
Fig. 9(b')
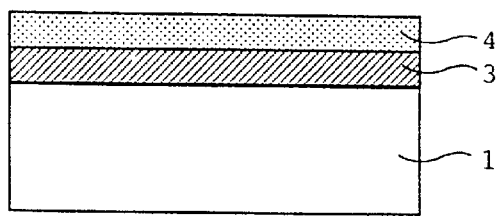
Fig. 9(c)
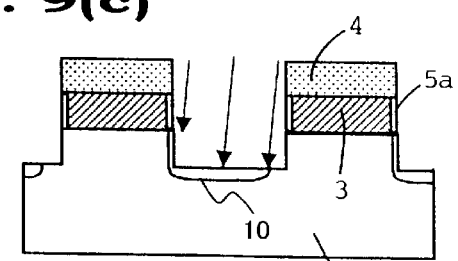
Fig. 9(c')
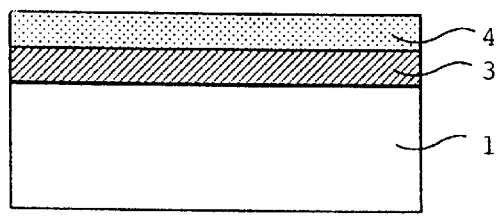
Fig. 9(d)
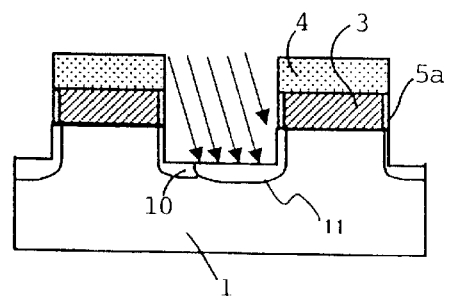
Fig. 9(d')
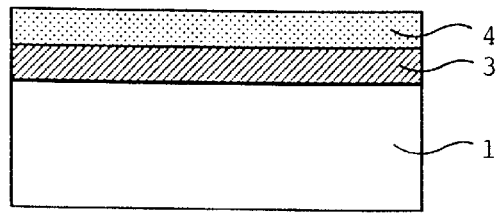

Fig. 10(e)
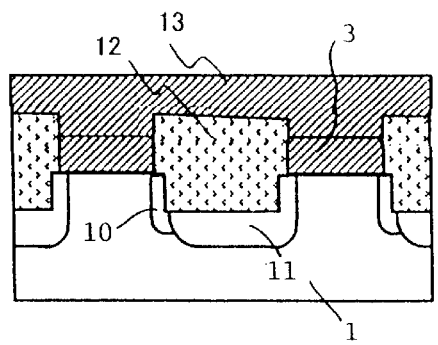
Fig. 10(e')
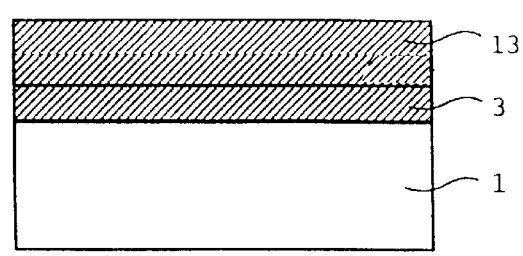
Fig. 10(f)
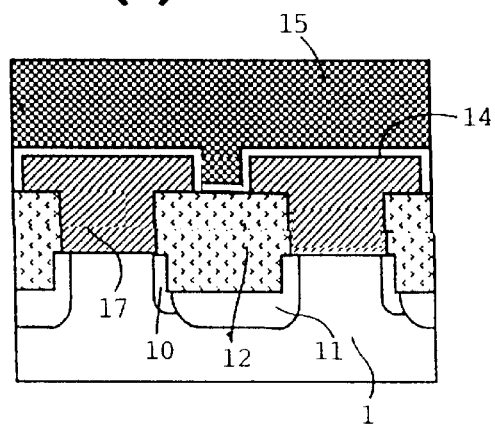
Fig. 10(f')
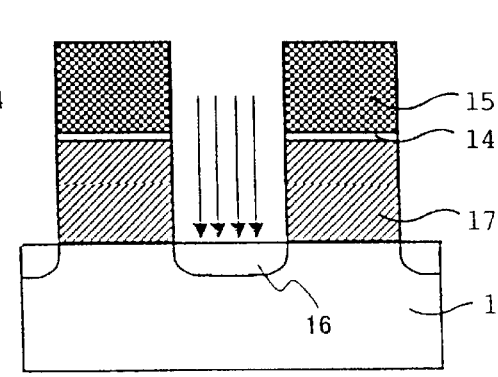

Fig. 11(a)
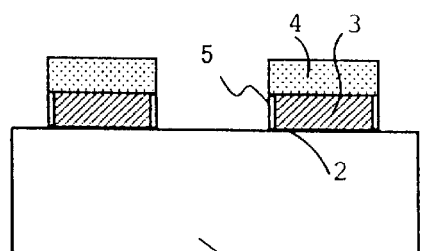
Fig. 11(a')
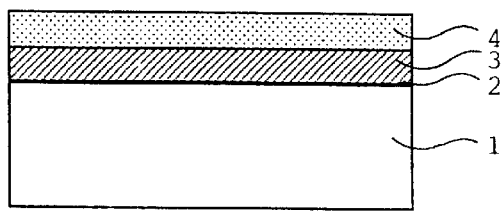
Fig. 11(b)
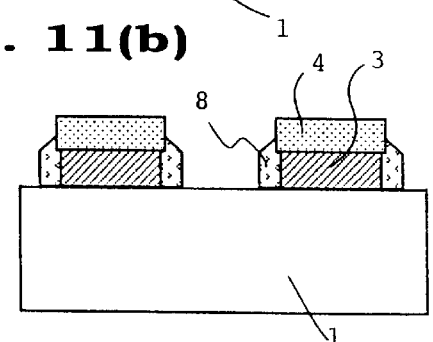
Fig. 11(b')
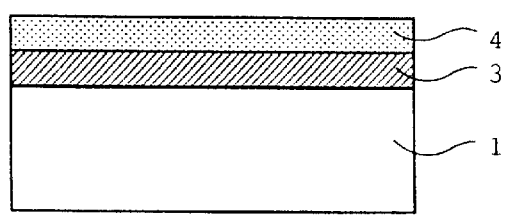
Fig. 11(c)
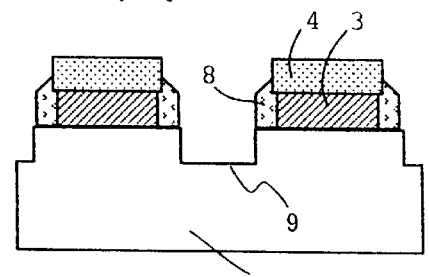
Fig. 11(c')
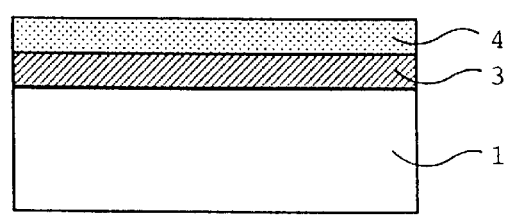
Fig. 11(d)
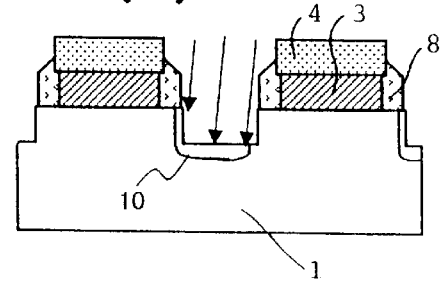
Fig. 11(d')
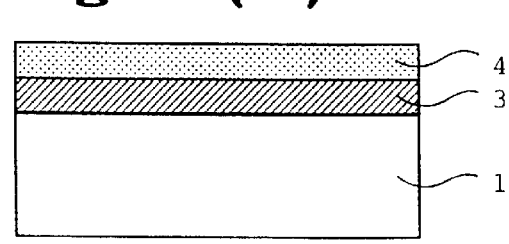

Fig. 12(e') 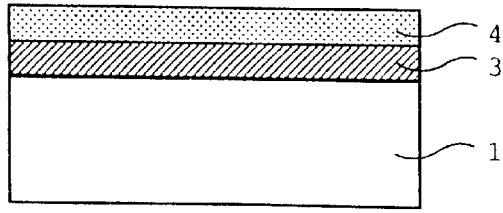

Fig. 12(f') 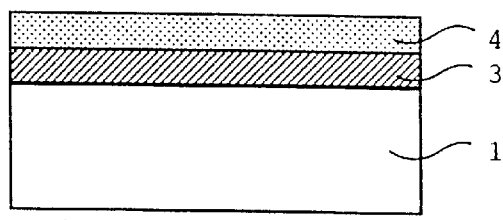

Fig. 12(g') 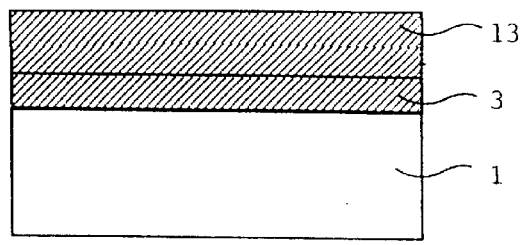

Fig. 12(h') 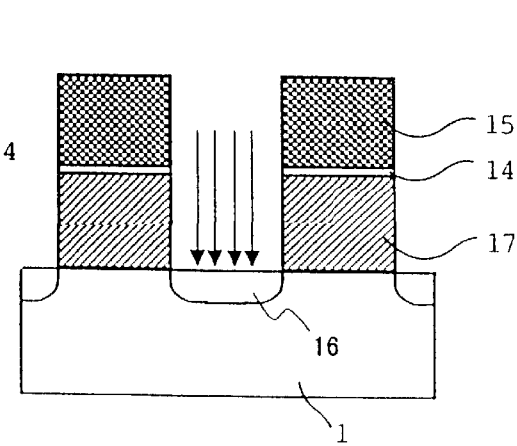

Fig. 13(a)
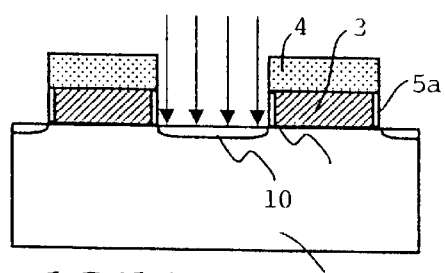
Fig. 13(a')
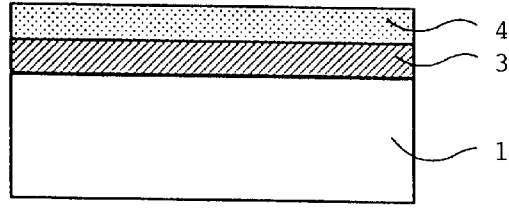
Fig. 13(b)
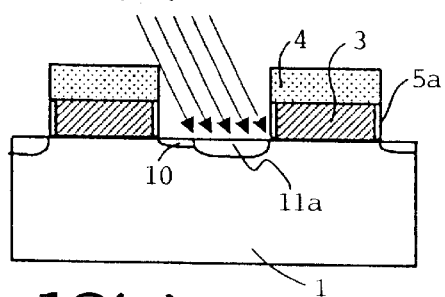
Fig. 13(b')
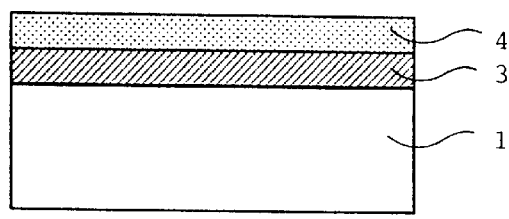
Fig. 13(c)
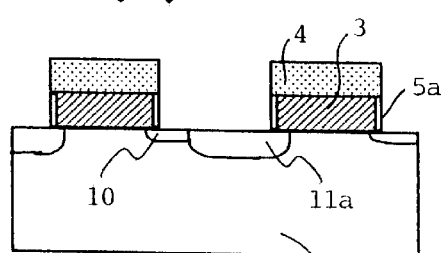
Fig. 13(c')
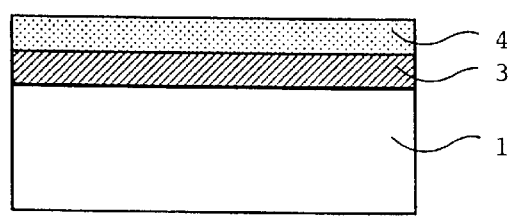
Fig. 13(d)
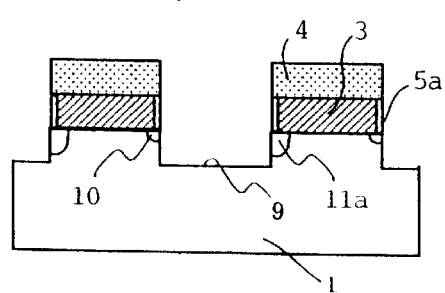
Fig. 13(d')
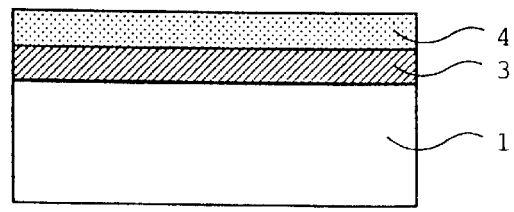

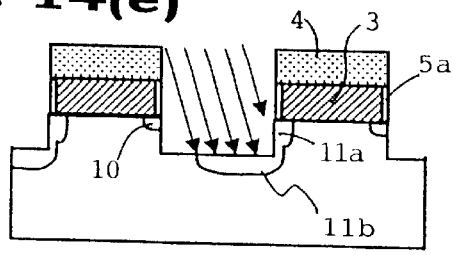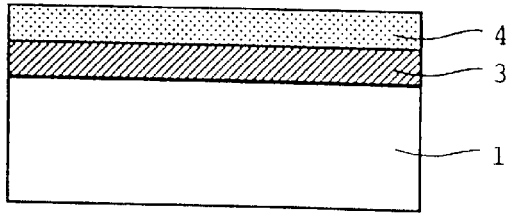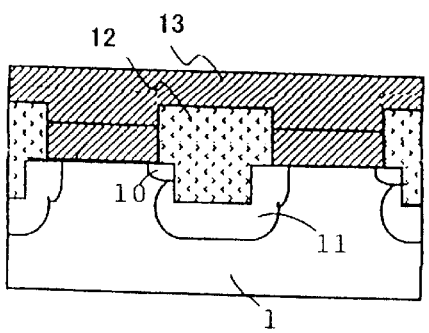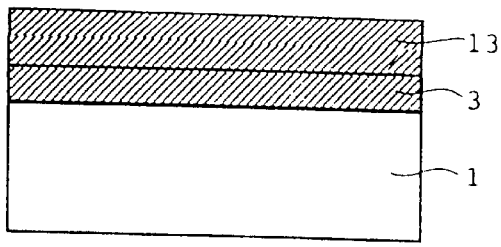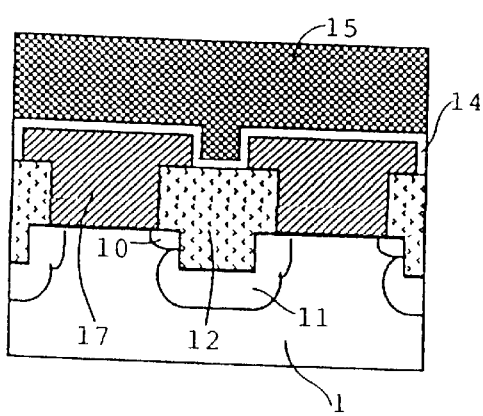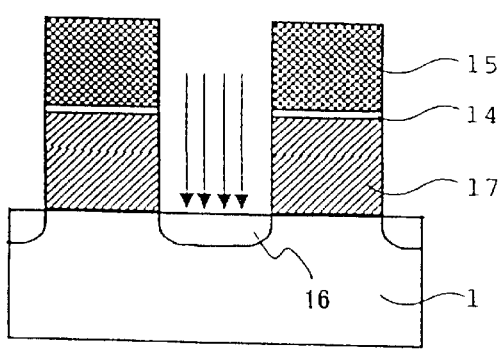

Fig. 16(a) (Prior Art)
Fig. 16(a') (Prior Art)
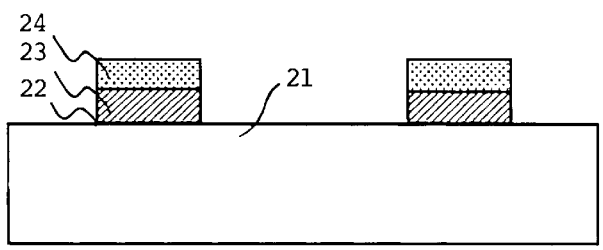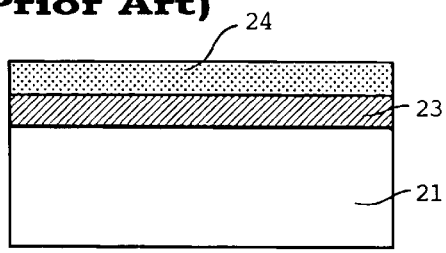
Fig. 16(b) (Prior Art)
Fig. 16(b') (Prior Art)
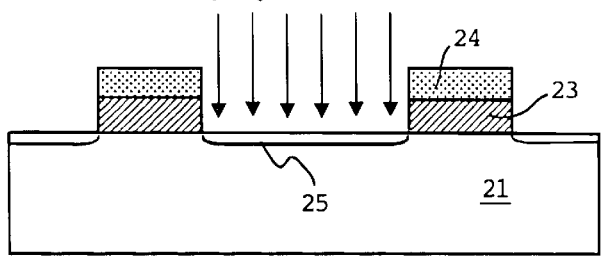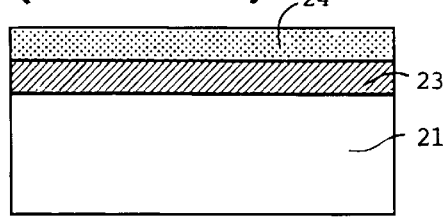
Fig. 16(c) (Prior Art)
Fig. 16(c') (Prior Art)
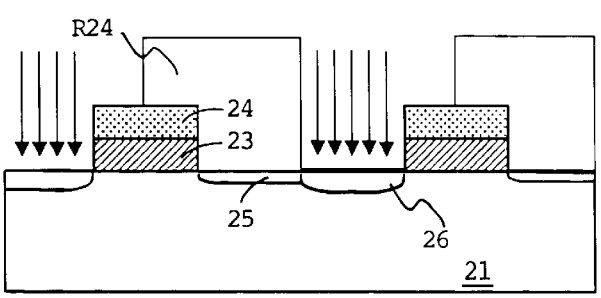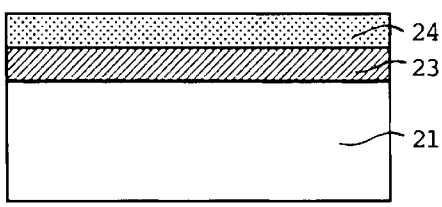
Fig. 16(d) (Prior Art)
Fig. 16(d') (Prior Art)
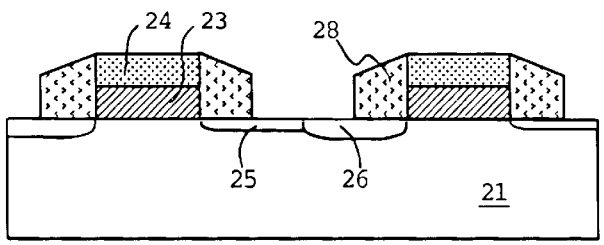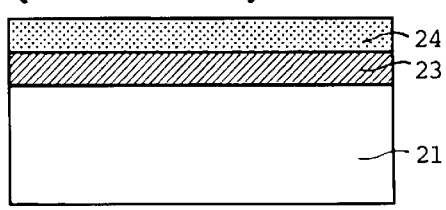
Fig. 16(e) (Prior Art)
Fig. 16(e') (Prior Art)
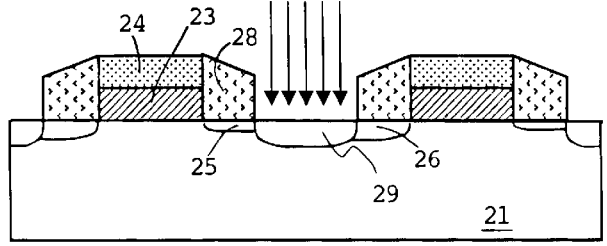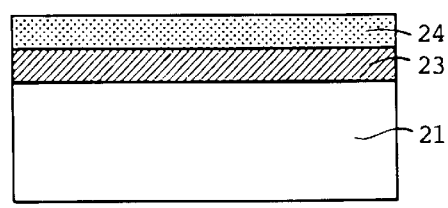

Fig. 17(f)
(Prior Art)
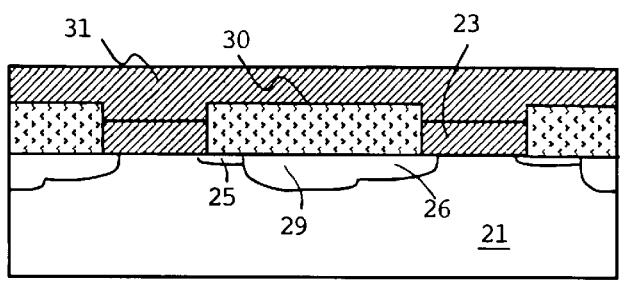
Fig. 17(f')
(Prior Art)
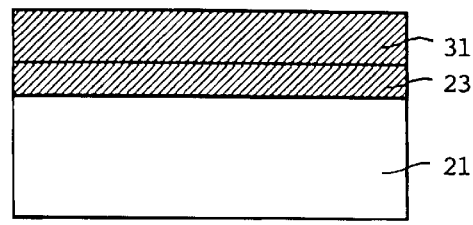
Fig. 17(g)
(Prior Art)
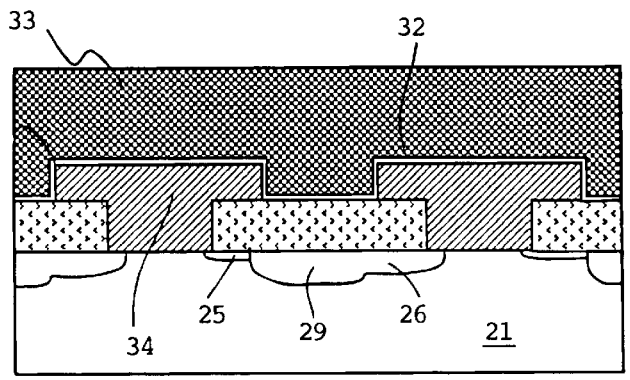
Fig. 17(g')
(Prior Art)
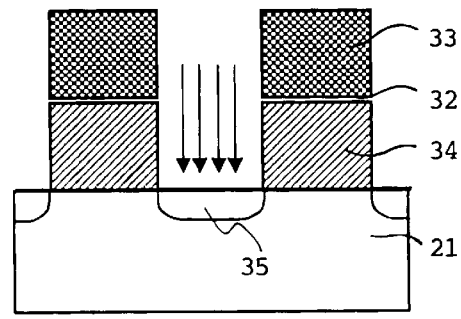

SEMICONDUCTOR MEMORY WITH SOURCE/DRAIN REGIONS ON WALLS OF GROOVES

CROSS-REFERENCES TO RELATED APPLICATIONS

This application is related to Japenese Patent Application No. HEI 11(1999)-352054, filed on Dec. 10, 1999 whose priority is claimed under 35 USC §119, the disclosures of which are incorporated by reference in their entirety.

BACKGROUND OF THE INVENTION

1. Field of the Invention

The present invention relates to a process for producing a semiconductor memory device and a semiconductor memory device, and more specifically, it relates to a process for producing a semiconductor memory device and a semiconductor memory device that have a floating gate and a control gate with an asymmetric source/drain region.

2. Description of the Related Art

A process for producing a semiconductor memory device having an asymmetric source/drain region is proposed, for example, in Japanese Patent Application Laid-open HEI 4(1992)-137558.

The process for producing a semiconductor memory device according thereto will be described below. FIG. 16(a) to FIG. 17(g) are cross sectional views on line X–X' in FIG. 15(a), and FIG. 16(a) to FIG. 17(g') are cross sectional views on line Y–Y' in FIG. 15(a).

As shown in FIGS. 16(a) and 16(a'), on an active region of a P type semiconductor substrate 21, a tunnel oxide film having a film thickness of about 10 nm, a phosphorous-doped polycrystalline silicon film 3 of about 100 nm and a silicon nitride film 4 of about 100 nm are sequentially deposited, and the silicon nitride film 4, the polycrystalline silicon film 3 and the tunnel oxide film 2 are sequentially etched by a reactive ion etching using a resist R21 (see FIG. 15(b)) patterned by a photolithography technique as a mask, so as to pattern for a floating gate.

After removing the resist R21, as shown in FIGS. 16(b) and 16(b'), arsenic ions, for example, are implanted at 0° with respect to the normal line of the substrate (hereinafter referred to as "0°") with an implantation energy from about 5 to about 40 keV and a dose from about $5 \times 10^{12}$ to about $5 \times 10^{13}$ ions/cm$^2$ using the floating gate as a mask, so as to form a low concentration impurity layer 25.

Thereafter, as shown in FIGS. 16(c) and 16(c'), after covering the low concentration impurity layer 25 with a resist R24 by a photolithography technique, arsenic ions are implanted at 0°, with an implantation energy from about 5 to about 40 keV and a dose from $1 \times 10^{15}$ to $1 \times 10^{16}$ ions/cm$^2$, so as to form a high concentration impurity layer 26.

After removing the resist R24, as shown in FIGS. 16(d) and 16(d'), a silicon oxide film to be an insulating film is deposited by a CVD (chemical vapor deposition) method to about 150 nm, and is etched back by a reactive ion etching, so as to form a side wall spacer 28 on a side wall of the floating gate. At this time, the width of the side wall spacer 28 is determined in such a manner that the high concentration impurity layer 26 is not present immediately under the side wall spacer 28 on the side of the low concentration impurity layer 25.

Subsequently, as shown in FIGS. 16(e) and 16(e'), arsenic ions, for example, are implanted at 0°, with an implantation energy from about 5 to about 40 keV and a dose from $1 \times 10^{15}$ to $1 \times 10^{16}$ ions/cm$^2$ using the side wall spacer 28 as a mask, so as to form a high concentration impurity layer 29.

Thereafter, the impurities are activated by a thermal treatment. A silicon oxide film to be a dielectric film is deposited by a CVD method to a thickness from about 400 nm to about 600 nm and is subjected to a CMP (chemical mechanical polishing) method, so as to fill a silicon oxide film 30 in a space between the floating gates. The silicon nitride film 24 is then removed by hot phosphoric acid. Subsequently, as shown in FIGS. 17(f) and 17(f'), a phosphorous-doped polycrystalline silicon film 31 is deposited in a thickness of about 100 nm to increase the gate coupling ratio.

Thereafter, as shown in FIGS. 17(g) and 17(g'), the polycrystalline silicon film 31 is processed by a reactive ion etching using a resist R22 patterned by a photolithography technique (see FIG. 15(b)), so as to form a stacked floating gate on the polycrystalline silicon film 23. After removing the resist R22, a silicon oxide film of 6 nm is deposited by a thermal oxidation on the surface of the stacked floating gate, and a silicon nitride film of 8 nm and a silicon oxide film of 6 nm are deposited thereon by a CVD method, in this order, so as to form an ONO film 32 (silicon oxide film/silicon nitride film/silicon oxide film) to be a dielectric film between a floating gate and a control gate. A polycide film (comprising a polycrystalline silicon film doped with phosphorous ions as an impurity of 100 nm and a tungsten silicide film of 100 nm) to be a control gate material is then deposited to a thickness of about 200 nm, and the polycide film, the ONO film 32, the polycrystalline silicon film 31 and the polycrystalline silicon film 23 are sequentially etched by a reactive ion etching using a resist R23 patterned by a photolithography technique (see FIG. 15(b)) as a mask, so as to form a control gate 33 and a floating gate 34. After removing the resist R23, boron ions, for example, are implanted at 0° with an implantation energy from about 10 to about 40 keV and a dose from $5 \times 10^{12}$ to $5 \times 10^{13}$ ions/cm$^2$ using the control gate 33 as a mask, so as to form an impurity layer 35 for isolation of memory elements.

Thereafter, according to the known process, an interlayer dielectric film is formed, and a contact hole and metallic wiring are formed.

An equivalent circuit of the source/drain asymmetric semiconductor memory device thus formed is shown in FIG. 18.

In FIG. 18, Tr.00 to Tr.32 are memory cells having a floating gate, WL0 to WL3 are word lines connected to the control gates of the memory cells, and BL0 to BL3 are bit lines connected to the drain/source common diffusion wiring layers of the memory cells. The word line WL0 is connected to the control gates of Tr.00, Tr.01 and Tr.02, and the word line WL1 is connected to the control gates of Tr.10, Tr.11 and Tr.12, respectively (the rest is omitted). The bit line BL1 is connected to the drains of Tr.01, Tr.11, Tr.21 and Tr.31 or the sources of Tr.00, Tr.10, Tr.20 and Tr.30, and the bit line BL2 is connected to the drains of Tr.02, Tr.12, Tr.22 and Tr.32 or the sources of Tr.01, Tr.11, Tr.21 and Tr.31.

The operation voltages of reading, writing and erasing a selected Tr.11 in FIG. 18 are shown in Table 1. Furthermore, FIG. 19 shows the state of reading Tr.11, FIG. 20 shows the state of writing Tr.11, and FIG. 21 shows the state of erasing Tr.10 to Tr.12 including Tr.11 connected to the word line WL1.

TABLE 1

|  | Selected WL | Non-selected WL | Selected BL | Non-selected BL | SL | Substrate |
|---|---|---|---|---|---|---|
|  | WL1 | WL0, 2 | BL1 | BL0, 3 | BL2 | PW |
| Reading | 3 | 0 | 0 | open | 1 | 0 |
| Writing | −12 | open | 4 | open | open | 0 |
| Erasing | 12 | open | −8 | −8 | −8 | −8 |

It is assumed that the writing of the memory cell is defined, for example, as Vth<2 V, and the erasing thereof is defined, for example, as Vth>4 V.

The writing method will be described with reference to FIG. 19 and Table 1. When a voltage of 3 V is applied to the control gate, the substrate and the drain are grounded and a voltage of 1 V is applied to the source, the information in the memory cell can be read out by detecting whether or not an electric current i flows between the source and the drain.

The reading method will be described with reference to FIG. 20 and Table 1. Upon writing in Tr.11, as shown in Table 1, a voltage of −12 V is applied to the control gate, the substrate is grounded, and a voltage of 4 V is applied to the drain, whereby electrons are drawn from the floating gate by using an FN tunnel electric current flowing in a thin oxide film in the overlapping region of the drain and the floating gate. At this time, while a voltage 4 V is also applied to the source of Tr.10 that is common to the drain applied with the positive voltage, a depletion layer spreads on the side of the substrate owing to the thin impurity concentration, and an electric current actually applied to the thin oxide film in the overlapping region of the drain and the floating gate becomes insufficient to generate the FN tunnel electric current. As a result, the writing selectively occurs only in such a memory cell that has a floating gate overlapping the drain side (high concentration impurity layer side).

The erasing method will be explained with reference to FIG. 21 and Table 1. Upon erasing Tr.11, when a voltage of 12 V is applied to the control gate and a voltage of −8 V is applied to the source/drain and the substrate, electrons can be injected in the floating gate by using an FN tunnel electric current flowing in the entire channel. At this time, the states of the applied voltage between the control gate and the source/drain/substrate of Tr.10 to Tr.12 connected to Tr.11 through the word line WL 1 are the same as each other, and the memory cells connected to the selected word line are simultaneously erased.

In the case where the width between the floating gates 34 is reduced for miniaturization in the semiconductor memory cell described in the foregoing, when the width of the low concentration impurity layer 25 is simply decreased, the impurity concentration of the overlapping region of the source region and the floating gate 34, which is essentially low, is increased due to the impurity diffusion from the high concentration impurity layer 29, whereby erroneous writing may occur in the adjacent non-selected cell. Therefore, in order to ensure the asymmetry of the low concentration impurity layer 25 and the high concentration impurity layer 26 to prevent the erroneous writing in the adjacent non-selected cell, the width of the side wall spacer is necessarily about 150 nm.

The bit line requires a sufficient impurity concentration and a sufficient cross sectional area in order to suppress the wiring resistance. Furthermore, the overlapping region of the drain region and the floating gate 34 necessarily has a sufficient impurity concentration for writing, and thus requires such a impurity concentration and a cross sectional area that the impurity concentration is not remarkably decreased. Therefore, the width of the high concentration impurity layer is necessarily about 300 nm.

Moreover, the high concentration impurity layer 26 should be certainly arranged immediately under the side wall spacer on the side of the high concentration impurity layer 26 with defining the position of the photoresist R24 in such a manner that the high concentration impurity layer 26 does not spread to the position immediately under the side wall spacer on the side of the low concentration impurity layer 25. Therefore, the overlapping accuracy of the floating gate and the photoresist R24 should be strictly considered. That is, in the case where the overlapping accuracy is about 150 nm, the width of the floating gate 34 is necessarily about 600 nm at the lowest.

Owing to the foregoing reasons, the width of the floating gate 34, i.e., the width of the bit line, is difficult to be decreased, and various problems arise in the further miniaturization of a semiconductor memory device.

SUMMARY OF THE INVENTION

The invention has been developed in view of the foregoing problems associated with the conventional art, and an object thereof is to provide a process for producing a semiconductor memory device and a semiconductor memory device that have a floating gate and a control gate, and can prevent an increase in resistance of a bit line arranged between the floating gates in such a semiconductor memory device that the source/drain region is asymmetric, while the bit line width can be decreased.

The preset invention provides with a process for producing a semiconductor memory device comprising the steps of:

(a) forming a floating gate on a semiconductor substrate through a dielectric film;

(b) forming a side wall spacer comprising an insulating film on a side wall of the floating gate;

(c) forming a groove by etching the semiconductor substrate using the side wall spacer as a mask; and (d) forming a low concentration impurity layer from one side wall to a bottom surface of the groove by an oblique ion implantation to the resulting semiconductor substrate, and forming a high concentration impurity layer from the other side wall to the bottom surface of the groove by an inverse oblique ion implantation.

Further, the present invention provides with a process for producing a semiconductor memory cell comprising the steps of:

(a) forming a floating gate on a semiconductor substrate through a dielectric film;

(x) forming a low concentration impurity layer on a surface of the semiconductor substrate by an ion implantation using the floating gate as a mask, and forming a high concentration impurity layer only on the other side than the floating gate by an oblique ion implantation to the surface of the semiconductor substrate;

(b') forming a side wall spacer comprising an insulating film on a side wall of the floating gate in a manner in that only the low concentration impurity layer is arranged immediately under the floating gate on one side of the floating gate;

(c') forming a groove by etching the semiconductor substrate using the side wall spacer as a mask to a depth deeper than a junction of the low concentration impurity layer and the high concentration impurity layer; and (d') electrically connecting the low concentration impurity layer and the high concentration impurity layer by conducting an ion implantation inside the groove.

Moreover, the present invention provides with a process for producing a semiconductor memory device comprising the steps of:

(a) forming a floating gate on a semiconductor substrate through a dielectric film;

(w) covering a side wall of the floating gate with an oxide film;

(x) forming a low concentration impurity layer on a surface of the semiconductor substrate by an ion implantation using the floating gate as a mask, and forming a high concentration impurity layer only on the other side than the floating gate by an oblique ion implantation to the surface of the semiconductor substrate;

(y) extending the low concentration impurity layer and the high concentration impurity layer to a position under the floating gate by a thermal treatment;

(c') forming a groove by etching the semiconductor substrate using the oxide film as a mask to a depth deeper than a junction of the low concentration impurity layer and the high concentration impurity layer; and (d') electrically connecting the low concentration impurity layer and the high concentration impurity layer by conducting an ion implantation inside the groove.

Furthermore, the present invention provides with a semiconductor memory device comprising a plurality of memory cells comprising a substrate which has at least two grooves formed therein and source/drain regions formed on sidewalls of the grooves, a floating gate formed on the semiconductor substrate between the grooves through a tunnel oxide film, a control gate formed on the floating gate through an interlayer capavitive film, wherein the source/drain regions comprise a low concentration impurity layer and a high concentration impurity layer, the low concentration impurity layer being formed on one sidewall of each the grooves and the high concentration impurity layer being formed on another sidewall of each the grooves, in each of the grooves, the low concentration impurity layer and the high concentration impurity layer are connected to each other through an impurity layer formed on a bottom surface of the groove.

BRIEF DESCRIPTION OF THE DRAWINGS

FIGS. 2(*a*) to 2(*e*) and 2(*a'*) to 2(*e'*) are schematic sectional views illustrating Example 1 of the process for manufacturing the semiconductor memory device according to the present invention;

FIGS. 4(*a*) to 4(*e*) and 4(*a'*) to 4(*e'*) are schematic sectional views illustrating Example 2 of the process for manufacturing the semiconductor memory device according to the present invention;

FIGS. 5(*f*) to 5(*g*) and 5(*f'*) to 5(*g'*) are schematic sectional views illustrating Example 1 of the process for manufacturing the semiconductor memory device according to the present invention;

FIGS. 6(*a*) to 6(*c*) and 6(*a'*) to 6(*c'*) are schematic sectional views illustrating Example 3 of the process for manufacturing the semiconductor memory device according to the present invention;

FIGS. 7(*a*) to 7(*e*) and 7(*a'*) to 7(*e'*) are schematic sectional views illustrating Example 4 of the process for manufacturing the semiconductor memory device according to the present invention;

FIGS. 8(*f*) to 8(*i*) and 8(*f'*) to 8(*i'*) are schematic sectional views illustrating Example 4 of the process for manufacturing the semiconductor memory device according to the present invention;

FIGS. 9(*a*) to 9(*d*) and 9(*a'*) to 9(*d'*) are schematic sectional views illustrating Example 5 of the process for manufacturing the semiconductor memory device according to the present invention;

FIGS. 10(*e*) to 10(*f*) and 10(*e'*) to 10(*f'*) are schematic sectional views illustrating Example 5 of the process for manufacturing the semiconductor memory device according to the present invention;

FIGS. 11(*a*) to 11(*d*) and 11(*a'*) to 11(*d'*) are schematic sectional views illustrating Example 6 of the process for manufacturing the semiconductor memory device according to the present invention;

FIGS. 13(*a*) to 13(*d*) and 13(*a'*) to 13(*d'*) are schematic sectional views illustrating Example 7 of the process for manufacturing the semiconductor memory device according to the present invention;

FIGS. 14(*e*) to 14(*g*) and 14(*e'*) to 14(*g'*) are schematic sectional views illustrating Example 7 of the process for manufacturing the semiconductor memory device according to the present invention;

FIGS. 16(*a*) to 16(*e*) and 16(*a'*) to 16(*e'*) are schematic sectional views illustrating the process for manufacturing a conventional semiconductor memory device.

FIGS. 17(*f*) to 17(*g*) and 17(*a'*) to 17(*g'*) are schematic sectional views illustrating the process for manufacturing a conventional semiconductor memory device.

PREFERRED EMBODIMENTS OF THE INVENTION

Figure 1A:
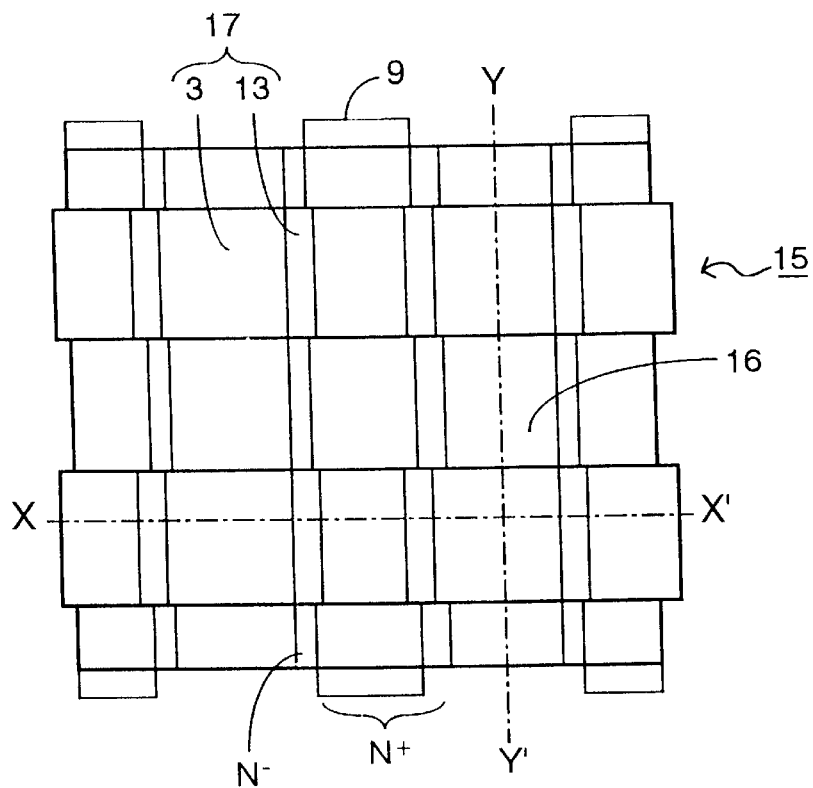
FIGS. 1(*a*) and 1(*b*) are schematic plan views illustrating a process for manufacturing a semiconductor memory device according to the present invention.

In the process for producing a semiconductor memory device according to the invention, a floating gate is firstly formed on a semiconductor substrate having a dielectric film in the step (a).

The semiconductor substrate used herein is not particularly limited and may be those generally used in a semiconductor memory device, and examples thereof include an element semiconductor, such as silicon and germanium, and a compound semiconductor, such as GaAs, InGaAs and ZnSe. Among these, silicon is preferred. It is preferred that the semiconductor substrate has been doped with an impurity to set the resistance thereof to an appropriate value.

The dielectric film is suitably those generally used as a tunnel oxide film, and can be formed on the substrate as a silicon oxide film having a thickness from about 7 nm to about 15 nm, for example, by a thermal oxidation and a CVD method.

The floating gate comprises an electroconductive film. Examples thereof include polysilicon; a metal, such as copper and aluminum; a high melting point metal, such as tungsten, tantalum and titanium; a silicide with the high melting point metal; and a polycide, among which polysilicon doped with a P type or N type impurity is preferred. The floating gate can be formed in such a manner that an electroconductive film having a thickness from about 50 nm to about 150 nm is formed by a sputtering, a vapor deposition or a CVD method, and then patterned by utilizing a resist mask having a desired shape formed by a known photolithography and etching technique. The floating gate formed herein may have a pattern that finally functions as a floating gate of the semiconductor device, but may also have a preliminary pattern that requires further pattering later.

In the step (b), a side wall spacer comprising an insulating film is formed on a side wall of the floating gate. The side wall spacer can be formed with an insulating film, such as a silicon oxide film, a silicon nitride film and a laminated film thereof. The side wall spacer can be formed by such a method that an insulating film having a thickness from about 25 nm to about 75 nm is deposited on the entire surface of the semiconductor substrate by a known process, such as a thermal oxidation, a CVD method, a plasma CVD method and a high density plasma CVD (HDP-CVD) method, and then subjected to etch back. According to the procedure, a side wall spacer having a width from about 25 nm to about 75 nm immediately on the semiconductor substrate.

As another method for forming the side wall spacer, it can be formed by subjecting the semiconductor substrate having the floating gate formed therein to a thermal treatment in an oxygen atmosphere or in the air at a temperature range from about 800° C. to about 1,000° C. from about 1 to about 100 minutes. The thickness of the oxide film formed by the thermal treatment is, for example, in a thickness from about 2 nm to about 50 nm. Since an oxide film is formed not only on the side wall of the floating gate but also on the exposed surface of the semiconductor substrate, it is preferred that the oxide film on the surface of the semiconductor substrate is removed after completing the thermal treatment, for example, by dry etching.

The side wall spacer may be formed to have a two-layer structure by conducting both the processes described in the foregoing. In this case, it is preferred that the side wall spacer formed with a thermal oxidation film is the first layer, and the side wall spacer formed by the formation of the dielectric film is the second layer.

In the step (c), the semiconductor substrate is etched by using the side wall spacer as a mask, so as to form a groove. Examples of the method for forming the groove include an isotropic or anisotropic dry etching process, such as an RIE process. The depth of the groove is not particularly limited and is preferably determined by considering a position and a width of a low concentration impurity layer and a high concentration impurity layer formed on the side wall of the groove in the later steps. Specifically, the depth of the groove may be from about 100 nm to about 200 nm. The size of the groove is not particularly limited. The groove may be formed by etching to have a side wall perpendicular to the surface of the semiconductor substrate or to have a tapered side wall.

In the step (d), a low concentration impurity layer is formed from one side wall to a bottom surface of the groove by an oblique ion implantation to the semiconductor substrate thus obtained. The oblique ion implantation herein means an ion implantation in a direction that is inclined at an angle from about 5° to about 30°, preferably from about 5° to about 10°, with respect to the normal line of the semiconductor substrate. By the oblique ion implantation, the floating gate and the side wall spacer having been formed can be used as a mask, and impurity ions can be implanted from one side surface to the bottom surface of the groove. The impurity herein is preferably such an impurity that has a different conductivity type from the impurity that has been doped in the semiconductor substrate. The conditions of the ion implantation can be appropriately adjusted depending on the performance and the size of the semiconductor device to be obtained and the thickness of the floating gate and the side wall spacer, and may be, for example, an implantation energy from about 5 keV to about 100 keV and a dose from about $1 \times 10^{14}$ to about $1 \times 10^{15}$ ions/cm².

A high concentration impurity layer is formed from the other side wall to the bottom surface of the groove by an inverse oblique ion implantation. The inverse oblique ion implantation herein means an ion implantation in a direction that is inclined at an angle from about –5° to about –30°, preferably from about –7° to about –25°, with respect to the normal line of the semiconductor substrate. By the inverse oblique ion implantation, the floating gate and the side wall spacer having been formed can be used as a mask, and an impurity can be implanted from the other side surface to the bottom surface of the groove. The impurity herein is preferably such an impurity that has a different conductivity type from the impurity that has been doped in the semiconductor substrate. The conditions of the inverse oblique ion implantation can be appropriately adjusted depending on the performance and the size of the semiconductor device to be obtained and the thickness of the floating gate and the side wall spacer, and may be, for example, an implantation energy from about 5 to about 100 keV and a dose from about $1 \times 10^{15}$ to about $1 \times 10^{16}$ ions/cm².

Either the oblique ion implantation or the inverse oblique ion implantation may be conducted first. According to these procedures of an ion implantation, the low concentration impurity layer is substantially formed on one side wall of the groove, and the high concentration impurity layer is substantially formed on the other side wall, and an impurity layer whose impurity concentration is substantially the same as or higher than that of the high concentration impurity layer is formed on the bottom surface of the groove.

After the ion implantation, it is preferred to conduct a thermal treatment for activation and diffusion of the impurity after completion of the both procedures of the ion implantation or in an appropriate occasion in the latter steps described later. The thermal treatment can be conducted according to a known method by selecting suitable conditions.

In the case where the side wall spacer is formed to have the two-layer structure in the preceding step, it is preferred that the second layer side wall spacer is selectively removed between the oblique ion implantation and the inverse oblique ion implantation. In this case, only the second layer of the side wall spacer can be selectively removed by various methods, such as a method utilizing the difference in etching rate based on the difference in materials of the dielectric films of the first layer and the second layer of the side wall spacer, for example, wet etching using, for example, hydrofluoric acid, hot phosphoric acid, nitric acid or sulfuric acid, and dry etching, such as an RIE process. In this case, it is preferred that after forming the low concentration impurity layer by the oblique ion implantation, the second layer side wall spacer is removed, and then the high concentration impurity layer is formed by the inverse oblique ion implantation. The angle for the ion implantation of the high concentration impurity layer is necessarily selected, so as not to implant the impurity in the low concentration impurity layer.

In the another process for producing a semiconductor memory device according to the invention, after forming the floating gate in the step (a) as similar to the foregoing manner, an ion implantation is conducted by using the floating gate as a mask in the step (x). The ion implantation herein means the oblique ion implantation in a direction inclined at an angle from about 0° to about 10° with respect to the normal line of the semiconductor substrate. According to the ion implantation, a low concentration impurity layer can be formed at least on one side of the floating gate, or on the entire surface of the semiconductor substrate between the floating gates. The impurity herein is preferably an impurity having a conductivity type different from that of the impurity doped in the semiconductor substrate. The conditions of the ion implantation can be appropriately adjusted as similar to the foregoing, and may be, for example, an implantation energy from about 5 to about 100 keV and a dose from about $1\times10^{12}$ to about $1\times10^{13}$ ions/cm$^2$.

Further, the reverse oblique ion implantation is conducted to the semiconductor substrate. The oblique ion implantation herein means an ion implantation in a direction inclined at an angle from about −1° to about −30°, preferably from about −7° to about −25°, with respect to the normal line of the semiconductor substrate. According to the ion implantation, a high concentration impurity layer can be formed at least on the other side of the floating gate, i.e., the side different from the side where the low concentration impurity layer is formed. The impurity herein is preferably an impurity having a conductivity type different from that of the impurity having been doped in the semiconductor substrate. The conditions of the ion implantation can be appropriately adjusted as similar to the foregoing, and may be, for example, an implantation energy from about 5 to about 100 keV and a dose from about $1\times10^{15}$ to about $1\times10^{16}$ ions/cm$^2$.

Either the procedures of the ion implantation may be conducted first. After the ion implantation, it is preferred to conduct a thermal treatment for activation and diffusion of the impurity after completion of the both procedures of the ion implantation or in an appropriate occasion in the latter steps described later. The thermal treatment can be conducted according to a known method by selecting known conditions.

The side wall of the floating gate may be covered with an oxide film before the step (x). Examples of the method for covering with an oxide film include the method for forming the side wall spacer in the step (b).

In the step (b'), a side wall spacer is formed on the side wall of the floating gate. The side wall spacer herein is the same as that in the step (b) in material and forming method thereof except that only the low concentration impurity layer is arranged immediately under the side wall spacer on one side of the floating gate. That is, in this step, it is necessary that the width of the side wall spacer on the semiconductor substrate is smaller than the width of the low concentration impurity layer on at least one side thereof, and preferably on the both sides thereof. Specifically, the width of the side wall spacer on the semiconductor substrate is preferably from about 25 nm to about 75 nm while it can be appropriately adjusted depending on the width of the low concentration impurity layer formed in the subsequent step.

In the step (c'), a groove is formed by etching the semiconductor substrate to a depth deeper than the junction of the low concentration impurity layer and the high concentration impurity layer by using the side wall spacer as a mask. The groove herein can be formed in the same manner as in the step (c) except that it is set to have a depth deeper than the junction of the low concentration impurity layer and the high concentration impurity layer. In the case where the low concentration impurity layer and the high concentration impurity layer are formed at the implantation energy and the dose in the step (x), the depth thereof is suitably from about 100 nm to about 200 nm while it can be appropriately adjusted depending on the conditions of the thermal treatment conducted later.

In the step (d'), an ion implantation is conducted inside the groove. The ion implantation herein means the oblique ion implantation in a direction inclined at an angle from about 0° to about −10° with respect to the normal line of the bottom surface of the groove. According to the ion implantation, an impurity layer can be formed from the bottom surface to the both side walls of the groove, and thus the low concentration impurity layer and the high concentration impurity layer formed in the subsequent step can be electrically connected to each other. The impurity herein is preferably an impurity having the same conductivity type as that of the impurity of the low concentration impurity layer and the high concentration impurity layer. The conditions of the ion implantation can be appropriately adjusted as similar to the foregoing, and may be, for example, an implantation energy from about 5 to about 100 keV and a dose from about $1\times10^{15}$ to about $1\times10^{16}$ ions/cm$^2$.

The surface of the groove thus obtained may be covered with an oxide film before the step (d'). Examples of the method for covering with an oxide film include a method that is substantially the same as the another method for forming the side wall spacer in the foregoing step (b).

Furthermore, in the still another process for producing a semiconductor memory device according to the invention, after forming the floating gate in the same manner as in the foregoing in the step (a), the side wall of the floating gate is covered with an oxide film in the step (w). Examples of the method for covering with an oxide film include a method that is substantially the same as the another method for forming the side wall spacer in the foregoing step (b).

In the step (x), a low concentration impurity layer is formed on the surface of the semiconductor substrate by conducting an ion implantation using the floating gate as a mask, and a high concentration impurity layer is formed only on the other side of the floating gate by conducting the oblique ion implantation to the surface of the semiconductor substrate. This step can be conducted in the same manner as the foregoing step (x).

In the step (y), the resulting semiconductor substrate is subjected to a thermal treatment. According to the thermal treatment, the low concentration impurity layer and the high concentration impurity layer can be extended to the position under the floating gate. It is preferred that the conditions of the thermal treatment are appropriately selected according to a known method, so as to ensure such an impurity concentration that particularly the low concentration impurity layer side does not contribute to writing and does not become high resistance upon reading. For example, examples thereof include conditions under a nitrogen atmosphere or an air in a temperature range from about 800° C. to about 1000° C. for about 1 to about 100 minutes.

The step (c') and the step (d') can be conducted in the same manner as the foregoing.

In the process for producing a semiconductor memory device according to the invention, such steps that are generally conducted to form a semiconductor device before, during and after the desired steps. For example, steps, such as a thermal treatment, formation of a dielectric film, formation of an electroconductive film, patterning of a floating gate and/or a control gate, formation of an interlayer dielectric film, formation of a contact hole, formation of a wiring layer, and an ion implantation for isolation of elements, can be appropriately conducted.

Specifically, it is preferred that after completion of all the steps of the production method, a dielectric film is formed on the semiconductor substrate including the groove, and the dielectric film is flattened to have the same surface as the floating gate. Examples of the dielectric film herein include a silicon oxide film, a silicon nitride film and a laminated film thereof. It is preferred that the dielectric film is formed, for example, by a thermal oxidation, a CVD method, a plasma CVD method or an HDP-CVD method, to have a thickness larger than the floating gate, for example from about 400 nm to about 600 nm. Examples of the method for flattening the dielectric film to have the same surface as the floating gate include whole surface etch back by dry etching or wet etching, and a CMP method.

A dielectric film to be an interlayer capacitive film is formed on the resulting semiconductor substrate at a position between the floating gate and the control gate. Examples of the interlayer capacitive film include a silicon oxide film, a silicon nitride film and a laminated film thereof, which can be formed in the similar manner as in the foregoing. The thickness of the interlayer capacitive film is suitably from about 10 nm to about 30 nm. It is possible that before forming the dielectric film, an electroconductive film is further formed on the formed floating gate and is then patterned, so as to form an upper layer floating gate functioning as an integrated floating gate, in order to increase the gate coupling ratio. The upper layer floating gate herein can be formed with the similar material by the similar manner as the floating gate in the step (a).

An electroconductive film to be a control gate is formed on the dielectric film. Examples of the electroconductive film include those films formed in the similar manner as the floating gate comprising the similar materials as exemplified for the floating gate. The floating gate and the control gate may be the films of the same kind or of different kinds. Among these, a polycide film of a high melting point metal is preferred. The thickness of the control gate is not particularly limited and is, for example, from about 100 nm to about 300 nm.

Thereafter, the electroconductive film to be the control gate, the dielectric film to be the interlayer capacitive film, the upper layer floating gate optionally provided, and the floating gate are sequentially patterned. The patterning can be conducted in substantially the same manner as in the pattering of forming the floating gate in the step (a). According to the patterning, the floating gate having been preliminary patterned in the step (a), the interlayer capacitive film and the control gate can be formed in a self alignment manner.

A semiconductor memory device produced by the process for producing a semiconductor memory device according to the invention can be operated in substantially the same manner in accordance with the operational principal described for the conventional art.

Examples of the process for producing a semiconductor memory device and the semiconductor memory device according to the invention will be described below with reference to the drawings.

EXAMPLE 1

A semiconductor memory device to be formed in this example has, as shown in FIG. 1(a), a floating gate 17 comprising a lower layer floating gate and an upper layer floating gate deposited thereon, and a control gate 15 formed on the floating gate.

Figure 3F:
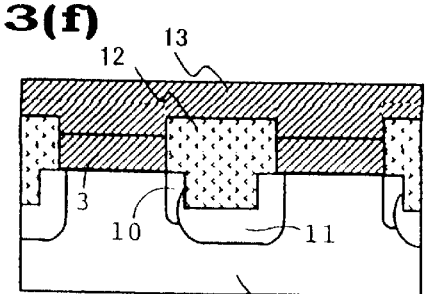
FIGS. 3(*f*) to 3(*g*) and 3(*f'*) to 3(*g'*) are schematic sectional views illustrating Example 1 of the process for manufacturing the semiconductor memory device according to the present invention.
Figure 3G:
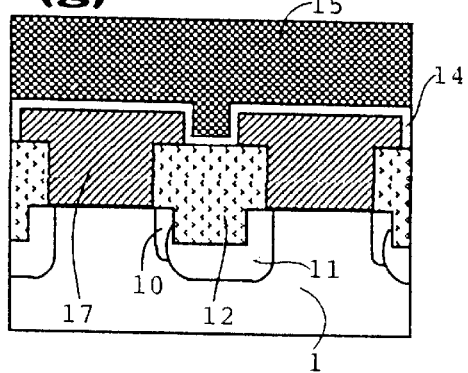
Figure 12E:
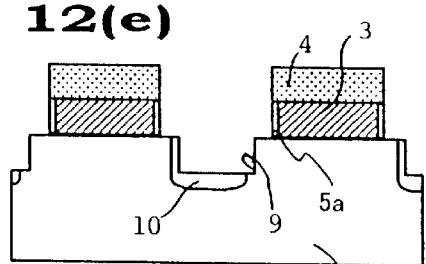
FIGS. 12(*e*) to 12(*h*) and 12(*e'*) to 12(*h'*) are schematic sectional views illustrating Example 6 of the process for manufacturing the semiconductor memory device according to the present invention.
Figure 12F:
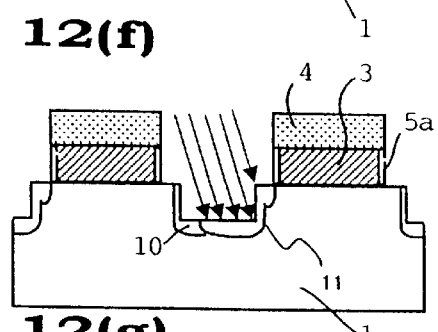
Figure 12G:
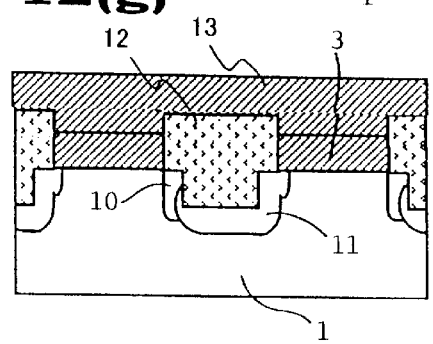
Figure 12H:
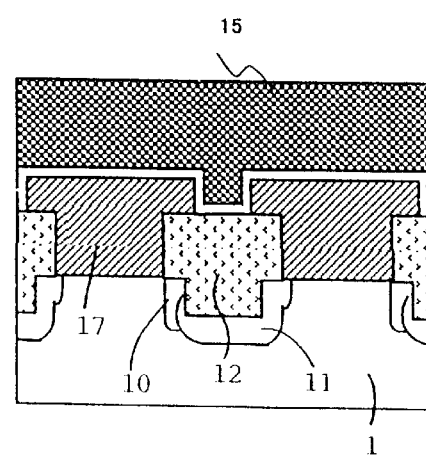
Figure 15A:
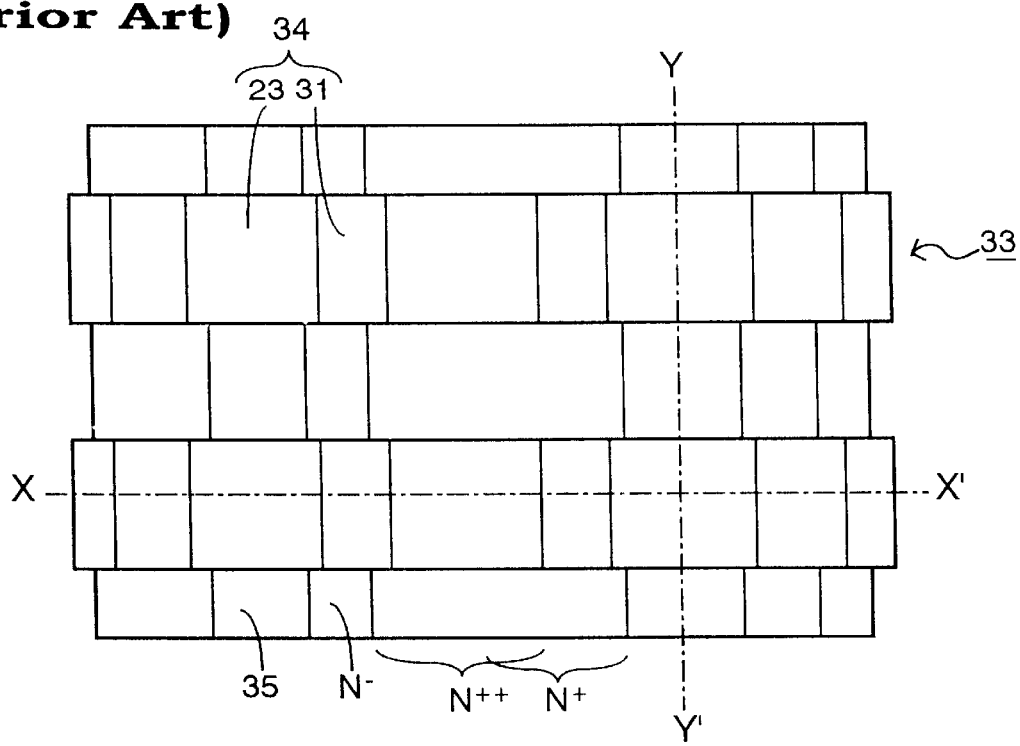
FIGS. 15(*a*) and 15(*b*) are schematic plan views illustrating the process for manufacturing a conventional semiconductor memory device.
Figure 15B:
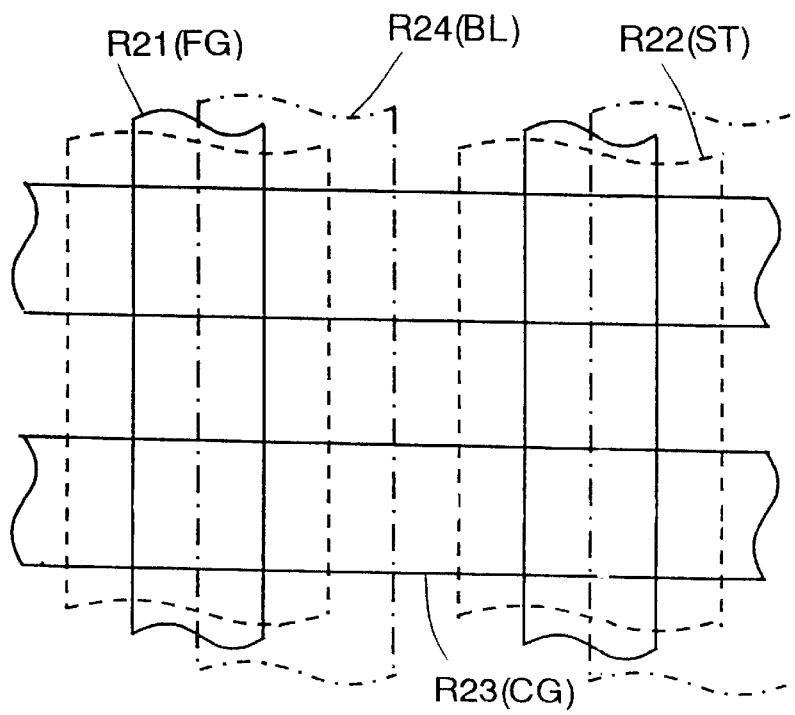
Figure 18:
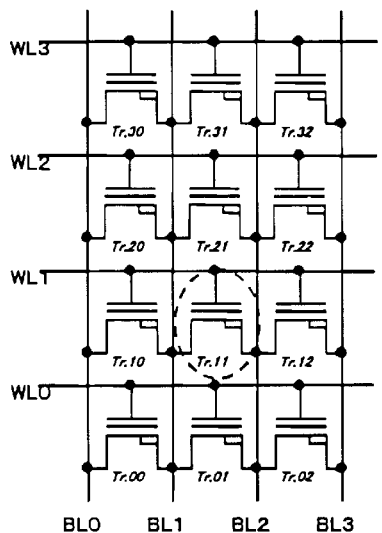
FIG. 18 is an equivalent circuit diagram illustrating an operation principle a conventional semiconductor memory device.
Figure 19:
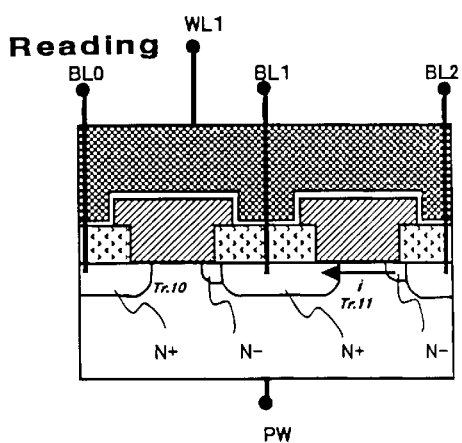
FIG. 19 is a perspective sectional view illustrating a reading principle of the conventional semiconductor memory device.
Figure 20:
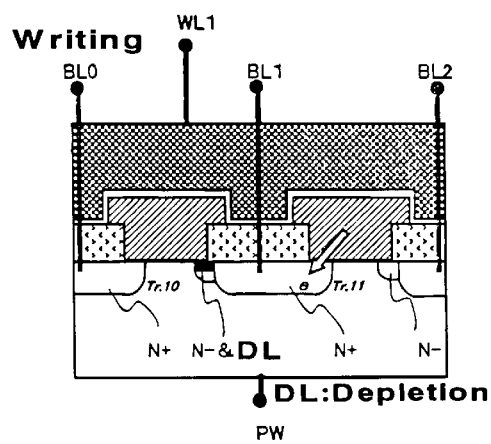
FIG. 20 is a perspective sectional view illustrating a writing principle of the conventional semiconductor memory device.
Figure 21:
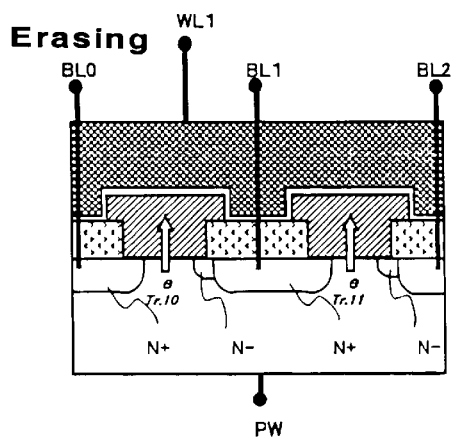
FIG. 21 is a perspective sectional view illustrating an erasing principle of the conventional semiconductor memory device.

That is, as shown in FIG. 3(g), the floating gate 17, an ONO film 14 and the control gate 15 are formed on an active region of a P type semiconductor substrate through a tunnel oxide film 2.

A groove 9 is formed on the P type semiconductor substrate 1 between the floating gates 17, and impurity layers are formed asymmetrically on a side wall and a bottom surface of the groove 9. The impurity layers are a low concentration impurity layer 10 arranged on the semiconductor substrate 1 overlapping the floating gate 17, and a high concentration impurity layer 11 arranged on the semiconductor substrate 1 overlapping the floating gate 17 and on the bottom surface of the groove. It is preferred that the difference in concentration between the low concentration impurity layer 10 and the high concentration impurity layer 11 is two or more digits. The depth of the groove is such that the concentration of the low concentration impurity layer 10 is not affected by diffusion from the high concentration impurity layer 11 arranged on the bottom surface of the groove, and the internal circumferential length (depth+width+depth) of the groove is such a value (about from 100 nm to 200 nm) that the wiring resistance of the impurity diffusion wiring layer becomes a sufficiently low resistance (about 50 Ω per square or less).

The semiconductor device can be produced by the following production method. FIG. 2(a) to FIG. 3(g) are cross sectional views on line X–X' in FIG. 1(a), and FIG. 2(a') to FIG. 3(g') are cross sectional views on line Y–Y' in FIG. 1(a).

Figure 1B:
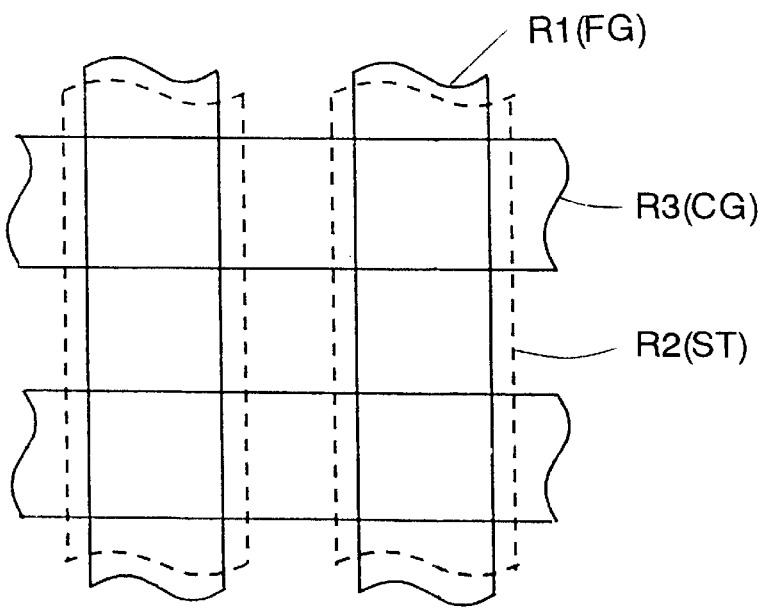

As shown in FIGS. 2(a) and 2(a'), on an active region of a P type semiconductor substrate 1, a tunnel oxide film 2 comprising a silicon oxide of about 10 nm, a phosphorous-doped polycrystalline silicon film 3 of about 100 nm to be a floating gate and a silicon nitride film 4 of about 100 nm to be a dielectric film are deposited by the conventional method. Subsequently, the silicon nitride film 4, the polycrystalline silicon film 3 and the tunnel oxide film 2 are sequentially etched by RIE using a resist R1 patterned by a photolithography technique (see FIG. 1(b)), so as to form a floating gate.

As shown in FIGS. 2(b) and 2(b'), after removing the resist R1, a silicon oxide film to be an insulating film is deposited to a thickness from about 25 to about 75 nm by a CVD method, and the silicon oxide film is subjected to etch back by RIE, so as to form a side wall spacer 8 on a side wall of the floating gate.

Subsequently, as shown in FIGS. 2(*c*) and 2(*c'*), the semiconductor substrate 1 is etched to a depth from about 100 nm to about 200 nm by using the side wall spacer 8 as a mask, so as to form a groove 9.

Thereafter, as shown in FIGS. 2(*d*) and 2(*d'*), arsenic ions, for example, are implanted by using the side wall spacer 8 as a mask at about +5° with an implantation energy from about 5 to about 40 keV and a dose from about $1\times10^{14}$ to $1\times10^{15}$ ions/cm², so as to form a low concentration impurity layer 10 from one side wall to a bottom surface of the groove 9 on the semiconductor substrate 1.

As shown in FIGS. 2(*e*) and 2(*e'*), arsenic ions, for example, are then implanted at about −10° with an implantation energy from about 5 to about 40 keV and a dose from about $1\times10^{15}$ to about $1\times10^{16}$ ions/cm², so as to form a high concentration impurity layer 11 from the other side wall to the bottom surface of the groove 9 on the semiconductor substrate 1.

Thereafter, the impurities are activated by a thermal treatment, and as shown in FIGS. 3(*f*) and 3(*f'*), a silicon oxide film to be a dielectric film is deposited by an HDP-CVD method to from about 400 nm to about 600 nm, so as to fill a silicon oxide film 12 in the groove 9 and a space between the floating gates by a CMP method. Subsequently, the silicon nitride film 4 is then removed by hot phosphoric acid (at this time, the upper surfaces of the silicon film 3 and the silicon oxide film 12 are not necessarily on the same plane). A phosphorous-doped polycrystalline silicon film 13 is deposited to about 100 nm in order to increase the gate coupling ratio.

Furthermore, as shown in FIGS. 3(*g*) and 3(*g'*), the polycrystalline silicon film 13 is processed by RIE using a resist R2 patterned by a photolithography technique (see FIG. 1(*b*)), so as to form a stacked floating gate on the polycrystalline silicon film 3. After removing the resist, a silicon oxide film of 6 nm is deposited by a thermal oxidation on the surface of the stacked floating gate, and a silicon nitride film of 8 nm and a silicon oxide film of 6 nm are deposited thereon by a CVD method, in this order, so as to form an ONO film 14 (silicon oxide film/silicon nitride film/silicon oxide film) to be a dielectric film between the floating gate 6 and a control gate. A polycide film (comprising a polycrystalline silicon film doped with phosphorous as an impurity of 100 nm and a tungsten silicide film of 100 nm) to be a control gate material is then deposited to about 200 nm, and the polycide film, the ONO film 14, the polycrystalline silicon film 13 and the polycrystalline silicon film 3 are sequentially etched by RIE using a resist R3 patterned by a photolithography technique (see FIG. 1(*b*)) as a mask, so as to form a control gate 15 and a floating gate 17. After removing the resist R3, boron ions, for example, are implanted at 0° with an implantation energy from about 10 to about 40 keV and a dose from about $5\times10^{12}$ to about $5\times10^{13}$ ions/cm² using the control gate 15 as a mask, so as to form an impurity layer 16 for isolation of memory elements.

Thereafter, according to the known process, an interlayer dielectric film is formed, and a contact hole and metallic wiring are formed.

EXAMPLE 2

As similar to Example 1, a tunnel oxide film 2, a phosphorous-doped polycrystalline silicon film 3 and a silicon nitride film 4 are deposited on an active region of a P type semiconductor substrate 1, which are then patterned to forming a floating gate. Subsequently, as shown in FIGS. 4(*a*) and 4(*a'*), arsenic ions, for example, are implanted at 0° with an implantation energy from about 5 to about 40 keV and a dose about $5\times10^{12}$ to about $5\times10^{13}$ ions/cm² by using the floating gate as a mask, so as to form a low concentration impurity layer 10.

As shown in FIGS. 4(*b*) and 4(*b'*), arsenic ions, for example, are implanted at about −7° to about −25° with an implantation energy from about 5 to about 40 keV and a dose about $5\times10^{15}$ to about $5\times10^{16}$ ions/cm² by using the floating gate as a mask, so as to form a high concentration impurity layer 11*a* only on the other side of the floating gate.

Thereafter, a silicon oxide film to be an insulating film is deposited by a CVD method to a thickness from about 25 nm to about 75 nm, and as shown in FIGS. 4(*c*) and 4(*c'*), the silicon oxide film is subjected to etch back by a reactive ion etching, so as to form a side wall spacer 8 on a side wall of the floating gate. At this time, the width of the side wall spacer 8 is determined in such a manner that the high concentration impurity layer 11*a* is not present immediately under one side of the side wall spacer 8.

Subsequently, as shown in FIGS. 4(*d*) and 4(*d'*), the semiconductor substrate 1 is etched to a depth from about 100 to about 200 nm by using the side wall spacer 8 as a mask, so as to form a groove 9. At this time, the depth of the groove 9 is determined to separate the low concentration impurity layer 10 and the high concentration impurity layer 11*a*.

Thereafter, as shown in FIGS. 4(*e*) and 4(*e'*), arsenic ions, for example, are implanted at 0° with an implantation energy from about 5 to about 40 keV and a dose about $5\times10^{15}$ to about $5\times10^{16}$ ions/cm² by using the side wall spacer 8 as a mask, so as to form a high concentration impurity layer 11*b* on a bottom surface of the groove 9. Subsequently, diffusion and activation of the impurities are conducted by a thermal treatment, so as to connect the high concentration impurity layers 11*a* and 11*b* to each other to make a high concentration impurity layer 11, and to electrically connect the low concentration impurity layer 10 and the high concentration impurity layer 11.

As shown in FIGS. 5(*f*) and 5(*f'*), as similar to Example 1, a silicon oxide film 12 is then filled in the groove 9 and a space between the floating gates, and a phosphorous-doped polycrystalline silicon film 13 is deposited on the floating gate and the silicon oxide film 12.

As shown in FIGS. 5(*g*) and 5(*g'*), as similar to Example 1, a stacked floating gate is then formed on the polycrystalline silicon film 3, and an ONO film 14 and a polycide film are formed. The polycide film, the ONO film 14, the polycrystalline silicon film 13 and the polycrystalline silicon film 3 are sequentially etched to form a control gate 15 and a floating gate 17, and further an impurity layer 16 for isolation of memory elements.

Thereafter, according to the known process, an interlayer dielectric film is formed, and a contact hole and metallic wiring are formed.

EXAMPLE 3

A floating gate, a side wall spacer 8, a low concentration impurity layer 10 and a high concentration impurity layer 11*a* are formed on a P type semiconductor substrate 1, and a groove 9 is formed on the surface of the semiconductor substrate 1 in the same manner as in FIGS: 4(*a*) and 4(*a'*) to FIGS. 4(*d*) and 4(*d'*) in Example 2.

Thereafter, as shown in FIGS. 6(*a*) and 6(*a'*), arsenic ions, for example, are implanted at about −10° with an implantation energy from about 5 to about 40 keV and a dose about $5 \times 10^{15}$ to about $5 \times 10^{16}$ ions/cm$^2$ by using the side wall spacer 8 as a mask, so as to form a high concentration impurity layer 11b on a bottom surface of the groove 9.

Subsequently, as shown in FIGS. 6(b) and 6(b'), diffusion and activation of the impurities are conducted by a thermal treatment, so as to connect the high concentration impurity layers 11a and 11b to each other to make a high concentration impurity layer 11, and to electrically connect the low concentration impurity layer 10 and the high concentration impurity layer 11. Subsequently, as similar to Example 1, a silicon oxide film 12 is then filled in the groove 9 and a space between the floating gates, and a phosphorous-doped polycrystalline silicon film 13 is deposited on the floating gate and the silicon oxide film 12.

As shown in FIGS. 6(c) and 6(c'), as similar to Example 1, a stacked floating gate is then formed on the polycrystalline silicon film 3, and an ONO film 14 and a polycide film are formed. The polycide film, the ONO film 14, the polycrystalline silicon film 13 and the polycrystalline silicon film 3 are sequentially etched to form a control gate 15 and a floating gate 17, and further an impurity layer 16 for isolation of memory elements.

Thereafter, according to the known process, an interlayer dielectric film is formed, and a contact hole and metallic wiring are formed.

EXAMPLE 4

As similar to Example 1, a tunnel oxide film 2, a phosphorous-doped polycrystalline silicon film 3 and a silicon nitride film 4 are deposited on an active region of a P type semiconductor substrate 1, which are then patterned to conduct processing of a floating gate. Subsequently, as shown in FIGS. 7(a) and 7(a'), an exposed part of the semiconductor substrate 1 and a side wall of the floating gate of the polycrystalline silicon film 3 are subjected to a thermal oxidation, so as to form a silicon oxide film 5 having a thickness from about 2 to about 50 nm.

Thereafter, as shown in FIGS. 7(b) and 7(b'), the silicon oxide film 5 on the semiconductor substrate 1 is removed by dry etching to make a silicon oxide film 5a remaining only on the side wall of the floating gate. Arsenic ions, for example, are implanted at 0° with an implantation energy from about 10 to about 40 keV and a dose about $5 \times 10^{12}$ to about $5 \times 10^{13}$ ions/cm$^2$ by using the silicon oxide film 5a and the floating gate as a mask, so as to form a low concentration impurity layer 10.

Subsequently, as shown in FIGS. 7(c) and 7(c'), arsenic ions, for example, are implanted at about −7° to about −25° with an implantation energy from about 5 to about 40 keV and a dose about $5 \times 10^{15}$ to about $5 \times 10^{16}$ ions/cm$^2$ by using the silicon oxide film 5a and the floating gate as a mask, so as to form a high concentration impurity layer 11a.

Thereafter, a silicon oxide film to be an insulating film is deposited by a CVD method to a thickness from about 25 to about 75 nm, and as shown in FIGS. 7(d) and 7(d'), the silicon oxide film is subjected to etch back by a reactive ion etching, so as to form a side wall spacer 8 on a side wall of the floating gate. At this time, the width of the side wall spacer 8 is determined in such a manner that the high concentration impurity layer 11a is not present immediately under one side of the side wall spacer 8.

Subsequently, as shown in FIGS. 7(e) and 7(e'), the semiconductor substrate 1 is etched to a depth from about 100 to about 200 nm by using the side wall spacer 8 as a mask, so as to form a groove 9. At this time, the depth of the groove 9 is determined to separate the low concentration impurity layer 10 and the high concentration impurity layer 11a.

As shown in FIGS. 8(f) and 8(f'), a silicon oxide film 6 having a thickness from about 2 to about 50 nm is formed in the groove 9.

Thereafter, as shown in FIGS. 8(g) and 8(g'), arsenic ions, for example, are implanted at 0° with an implantation energy from about 15 to about 60 keV and a dose about $5 \times 10^{15}$ to about $5 \times 10^{16}$ ions/cm$^2$ by using the side wall spacer 8 as a mask, so as to form a high concentration impurity layer 11b on a bottom surface of the groove 9.

Subsequently, as shown in FIGS. 8(h) and 8(h'), diffusion and activation of the impurities are conducted by a thermal treatment, so as to connect the high concentration impurity layers 11a and 11b to each other to make a high concentration impurity layer 11, and to electrically connect the low concentration impurity layer 10 and the high concentration impurity layer 11. As similar to Example 1, a silicon oxide film 12 is then filled in the groove 9 and a space between the floating gates, and a phosphorous-doped polycrystalline silicon film 13 is deposited on the floating gate and the silicon oxide film 12.

As shown in FIGS. 8(i) and 8(i'), as similar to Example 1, a stacked floating gate is then formed on the polycrystalline silicon film 3, and an ONO film 14 and a polycide film are formed. The polycide film, the ONO film 14, the polycrystalline silicon film 13 and the polycrystalline silicon film 3 are sequentially etched to form a control gate 15 and a floating gate 17, and further an impurity layer 16 for isolation of memory elements.

Thereafter, according to the known process, an interlayer dielectric film is formed, and a contact hole and metallic wiring are formed.

EXAMPLE 5

As shown in FIGS. 9(a) and 9(a'), as similar to Example 4, a tunnel oxide film 2, a phosphorous-doped polycrystalline silicon film 3 and a silicon nitride film 4 are deposited on a P type semiconductor substrate 1, which are then patterned to form a floating gate, and a silicon oxide film 5 is formed on an exposed part of the semiconductor substrate 1 and a side wall of the floating gate of the polycrystalline silicon film 3.

Thereafter, as shown in FIGS. 9(b) and 9(b'), the silicon oxide film 5 on the semiconductor substrate 1 is removed by dry etching to make a silicon oxide film 5a remaining only on the side wall of the floating gate, and further, the semiconductor substrate 1 is etched by using the floating gate and the silicon oxide film 5a as a mask to a depth from about 100 to about 200 nm, so as to form a groove 9.

Subsequently, as shown in FIGS. 9(c) and 9(c'), arsenic ions, for example, are implanted at about +5° with an implantation energy from about 5 to about 40 keV and a dose about $5 \times 10^{14}$ to about $5 \times 10^{15}$ ions/cm$^2$ by using the silicon oxide film 5a and the floating gate as a mask, so as to form a low concentration impurity layer 10 from one side wall to a bottom surface of the groove 9 of the semiconductor substrate 1.

As shown in FIGS. 9(d) and 9(d'), arsenic ions, for example, are implanted at about −10° with an implantation energy from about 5 to about 40 keV and a dose about $5 \times 10^{15}$ to about $5 \times 10^{16}$ ions/cm$^2$ by using the silicon oxide film 5a as a mask, so as to form a high concentration impurity layer 11 from the other side wall to the bottom surface of the groove 9 of the semiconductor substrate 1.

Thereafter, the impurities are activated by a thermal treatment, and as shown in FIGS. 10(*e*) and 10(*e'*), as similar to Example 1, a silicon oxide film 12 is then filled in the groove 9 and a space between the floating gates, and a phosphorous-doped polycrystalline silicon film 13 is deposited on the floating gate and the silicon oxide film 12.

As shown in FIGS. 10(*f*) and 10(*f'*), as similar to Example 1, a stacked floating gate is then formed on the polycrystalline silicon film 3, and an ONO film 14 and a polycide film are formed. The polycide film, the ONO film 14, the polycrystalline silicon film 13 and the polycrystalline silicon film 3 are sequentially etched to form a control gate 15 and a floating gate 17, and further an impurity layer 16 for isolation of memory elements.

Thereafter, according to the known process, an interlayer dielectric film is formed, and a contact hole and metallic wiring are formed.

EXAMPLE 6

As shown in FIGS. 11(*a*) and 11(*a'*), as similar to Example 4, a tunnel oxide film 2, a phosphorous-doped polycrystalline silicon film 3 and a silicon nitride film 4 are deposited on a P type semiconductor substrate 1, which are then patterned to form a floating gate, and a silicon oxide film 5 is formed on an exposed part of the semiconductor substrate 1 and a side wall of the floating gate of the polycrystalline silicon film 3. Further, the silicon oxide film 5 on the semiconductor substrate 1 is removed by dry etching to make a silicon oxide film 5*a* remaining only on the side wall of the floating gate.

As shown in FIGS. 11(*b*) and 11(*b'*), a silicon oxide film to be an insulating film is deposited by a CVD method to a thickness from about 25 to about 75 nm, and the silicon oxide film is subjected to etch back by a reactive ion etching, so as to form a side wall spacer 8 on a side wall of the floating gate.

Subsequently, as shown in FIGS. 11(*c*) and 11(*c'*), the semiconductor substrate 1 is etched by using the floating gate spacer 8 as a mask to a depth from about 100 to about 200 nm, so as to form a groove 9.

Thereafter, as shown in FIGS. 11(*d*) and 11(*d'*), arsenic ions, for example, are implanted at about +5° with an implantation energy from about 5 to about 40 keV and a dose about $5 \times 10^{14}$ to about $5 \times 10^{15}$ ions/cm$^2$ by using the side wall spacer 8 as a mask, so as to form a low concentration impurity layer 10 from one side wall to a bottom surface of the groove 9 of the semiconductor substrate 1.

As shown in FIGS. 12(*e*) and 12(*e'*), only the side wall spacer 8 is then selectively removed by utilizing the difference in wet etching rate between the side wall spacer 8 comprising a CVD silicon oxide film and the silicon oxide film 5*a* comprising a thermal oxidation film.

Subsequently, as shown in FIGS. 12(*f*) and 12(*f'*), arsenic ions, for example, are implanted at about −10° with an implantation energy from about 5 to about 40 keV and a dose about $5 \times 10^{15}$ to about $5 \times 10^{16}$ ions/cm$^2$ by using the floating gate and the silicon oxide film 5*a* as a mask, so as to form a high concentration impurity layer 11 from the other side wall to the bottom surface of the groove 9 of the semiconductor substrate 1.

Thereafter, the impurities are activated by a thermal treatment, and as shown in FIGS. 12(*g*) and 12(*g'*), as similar to Example 1, a silicon oxide film 12 is then filled in the groove 9 and a space between the floating gates, and a phosphorous-doped polycrystalline silicon film 13 is deposited on the floating gate and the silicon oxide film 12.

As shown in FIGS. 12(*h*) and 12(*h'*), as similar to Example 1, a stacked floating gate is then formed on the polycrystalline silicon film 3, and an ONO film 14 and a polycide film are formed. The polycide film, the ONO film 14, the polycrystalline silicon film 13 and the polycrystalline silicon film 3 are sequentially etched to form a control gate 15 and a floating gate 17, and further an impurity layer 16 for isolation of memory elements.

Thereafter, according to the known process, an interlayer dielectric film is formed, and a contact hole and metallic wiring are formed.

EXAMPLE 7

As shown in FIGS. 13(*a*) and 13(*a'*), as similar to Example 4, a tunnel oxide film 2, a phosphorous-doped polycrystalline silicon film 3 and a silicon nitride film 4 are deposited on a P type semiconductor substrate 1, which are then patterned to form a floating gate, and a silicon oxide film 5 is formed on an exposed part of the semiconductor substrate 1 and a side wall of the floating gate of the polycrystalline silicon film 3. Further, the silicon oxide film on the semiconductor substrate is removed by dry etching to make a silicon oxide film 5*a* remaining only on a side wall of the floating gate. Arsenic ions, for example, are implanted at 0° with an implantation energy from about 5 to about 40 keV and a dose about $5 \times 10^{12}$ to about $5 \times 10^{13}$ ions/cm$^2$ by using the floating gate and the silicon oxide film 5*a* as a mask, so as to form a low concentration impurity layer 10.

As shown in FIGS. 13(*b*) and 13(*b'*), arsenic ions, for example, are implanted at about −7° to about −25° with an implantation energy from about 5 to about 40 keV and a dose about $5 \times 10^{15}$ to about $5 \times 10^{16}$ ions/cm$^2$ by using the floating gate and the silicon oxide film 5*a* as a mask, so as to form a high concentration impurity layer 11*a* only on one side of the floating gate.

Subsequently, as shown in FIGS. 13(*c*) and 13(*c'*), diffusion and activation of the impurities are conducted by a thermal treatment, so as to overlap both the low concentration impurity layer 10 and the high concentration impurity layer 11*a* under the floating gate.

Thereafter, as shown in FIGS. 13(*d*) and 13(*d'*), the semiconductor substrate 1 is etched by using the floating gate and the silicon oxide film 5*a* as a mask to a depth from about 100 to about 200 nm, so as to form a groove 9. At this time, the depth of the groove 9 is determined to separate the low concentration impurity layer 10 and the high concentration impurity layer 11*a*.

As shown in FIGS. 14(*e*) and 14(*e'*), arsenic ions, for example, are implanted at about −10° with an implantation energy from about 5 to about 40 keV and a dose about $5 \times 10^{15}$ to about $5 \times 10^{16}$ ions/cm$^2$ by using the floating gate and the silicon oxide film 5*a* as a mask, so as to form a high concentration impurity layer 11*b* on a bottom surface of the groove 9.

Subsequently, as shown in FIGS. 14(*f*) and 14(*f'*), diffusion and activation of the impurities are conducted by a thermal treatment, so as to connect the high concentration impurity layers 11*a* and 11*b* to each other to make a high concentration impurity layer 11, and to electrically connect the low concentration impurity layer 10 and the high concentration impurity layer 11. Thereafter, as similar to Example 1, a silicon oxide film 12 is filled in the groove 9 and a space between the floating gates, and a phosphorous-doped silicon film 13 is deposited on the floating gate and the silicon oxide film 12.

As shown in FIGS. 14(*g*) and 14(*g'*), as similar to Example 1, a stacked floating gate is then formed on the polycrystalline silicon film 3, and an ONO film 14 and a polycide film are formed. The polycide film, the ONO film 14, the polycrystalline silicon film 13 and the polycrystalline silicon film 3 are sequentially etched to form a control gate 15 and a floating gate 17, and further an impurity layer 16 for isolation of memory elements.

Thereafter, according to the known process, an interlayer dielectric film is formed, and a contact hole and metallic wiring are formed.

According to the process for producing a semiconductor memory device of the invention, because the impurity layer of a high concentration is formed on the bottom surface of the groove formed on the semiconductor substrate, the impurity layer can have a cross sectional area that is sufficient to function as a diffusion wiring layer. Therefore, the miniaturization of the designed line width of the diffusion wiring layer can be easily conducted, and the number of bit lines per unit length can be increased, whereby the area of a cell array can be miniaturized.

Because the low concentration impurity layer and the high concentration impurity layer formed along the groove can be formed by an ion implantation of an impurity in a self alignment manner with the side wall spacer on the side wall of the floating gate without the use of a resist mask, the production process can be simplified, and the width between the floating gates can be decreased. Furthermore, when the inverse oblique ion implantation is conducted at a small angle, the implantation of an impurity can be easily conducted to both the side wall and the bottom surface of the groove even in the case where the width between the floating gates is decreased.

Moreover, because the implantation depth of the impurity to the side wall of the groove can be considerably small, unevenness of the impurity distribution after the ion implantation is small, and the impurity concentration under the floating gate can be easily controlled, whereby fluctuation of the cell characteristics, such as a writing speed, can be suppressed.

Furthermore, the difference between the impurity concentration on the side wall of the groove and the impurity concentration of the bottom surface thereof can be one or more digit with one time implantation by operating the oblique angle of the side wall of the groove and the angle of the ion implantation. Further, when the ion implantation for the high concentration impurity layer and the ion implantation of the low concentration impurity layer are conducted in directions that are inverse to each other, asymmetry (concentration difference by about two or more digits) can be sufficiently ensured on three surfaces, i.e., both the side walls and the bottom surface, inside the groove only two times ion implantation. Therefore, the process cost can be reduced by simplification of the number of steps, whereby the cost per one chip can be suppressed.

Because an impurity layer having an impurity concentration higher by about one or more digit than the impurity concentration required for writing, i.e., an impurity concentration higher by about one or more digit than the impurity concentration in the high concentration impurity layer, can be simultaneously formed on the bottom surface of the groove, the resistance of the diffusion wiring layer can be decreased, and the number of word lines per one block, i.e., the cell number, can be increased to reduce the total number of selected transistors arranged in the respective block, whereby further miniaturization of the area of the cell array can be realized.

Furthermore, by an ion implantation of an impurity in a self aligning manner to the side wall spacer on the side wall of the floating gate, the impurity is not implanted in or passed through the dielectric film functioning as a tunnel oxide film, so as to avoid deterioration in film quality of the tunnel oxide film, whereby the reliability of the cell characteristics can be improved. Further, the width of the side wall spacer should be determined by considering unevenness of the width of the low concentration impurity layer due to the unevenness of the width of the side wall spacer in the conventional technique, but in the process of the invention, the width of the low concentration impurity layer can be determined by the depth of the groove irrespective to the width of the side wall spacer, and thus the miniaturization of the width of the side wall spacer can be easily conducted. Further, because the high concentration impurity layer and the low concentration impurity layer can be connected by the oblique ion implantation and the inverse oblique ion implantation, a thermal treatment step can be omitted, so as to suppress deterioration in film quality of the tunnel oxide film caused by the thermal treatment step, whereby deterioration in cell characteristics on repeated writing and erasing can be suppressed to ensure high reliability.

Because the impurity concentration of the impurity layer immediately under the floating gate can be easily controlled by adjusting the width of the side wall spacer, miniaturization of the overlapping width of the floating gate and the high concentration impurity layer, i.e., miniaturization of the floating gate, can be realized without impairing the cell characteristics, such as a writing speed, and the number of bit lines per unit length can be further increased, whereby the area of the cell array can be further decreased, so as to easily realize a high capacity.

Particularly, in the case where the side wall of the floating gate is coated by a thermal oxidation film by a thermal treatment as the side wall spacer, since the thickness of the thermal oxidation film can be easily controlled, the width of the groove can be easily controlled to further reduce the width between the floating gates.

Furthermore, in the case where the two-layer structure of the thermal oxidation film (first layer) and the dielectric film (second layer) is employed as the side wall spacer, and the second layer side wall spacer is selectively removed between the oblique ion implantation and the inverse oblique ion implantation, because an impurity can be simultaneously implanted at a high concentration to the surface of the semiconductor substrate as a surface in the vicinity of the floating gate and the three surfaces, i.e., both the side walls and the bottom surfaces, of the groove, so as to form, with good control, a high concentration impurity layer required for writing in the vicinity of the floating gate, the cross sectional area of the high concentration impurity layer can be ensured with the width between the floating gates being decreased, and as a result, fluctuation in cell characteristics, such as a writing speed, can be further suppressed. Moreover, even when the dielectric film as the second layer is removed upon implantation of the impurity to a high concentration, the impurity is not implanted in or passed through the tunnel oxide film even when the impurity is implanted at a shallow angle since the side wall of the floating gate is covered with the thermal oxidation film, so as to avoid deterioration in film quality of the tunnel oxide film due to the ion implantation, and thus the reliability of the cell characteristics can be further improved.

According to the another process for producing a semiconductor memory device of the invention, in addition to the effects of the process for producing a semiconductor memory device described in the foregoing, because the high concentration impurity layer and the low concentration impurity layer are formed in the vicinity of the floating gate before forming the side wall spacer, the asymmetric impurity diffusion layer can be formed with good control, and the impurity concentration of the impurity layer under the floating gate can be easily controlled, whereby fluctuation in cell characteristics, such as a writing speed, can be suppressed. Moreover, because the impurity layer formed immediately under the side wall spacer and that formed on the bottom surface of the groove can be individually controlled, modification of the process can be easily conducted, and thus adaptation to other processes and improvement in cell characteristics are easily conducted. Further, because after the formation of the low concentration impurity layer and the high concentration impurity layer, the groove is formed to remove the boundary parts thereof, erroneous writing, unevenness of writing and unevenness of the wiring resistance caused by deviation of the boundary parts can be prevented, and thus highly reliable cell characteristics can be obtained.

Particularly, in the case where the ion implantation is conducted to the bottom surface of the groove in the perpendicular direction, the impurity can be implanted to a sufficient concentration to the bottom surface of the groove even when the width of the groove is miniaturized.

In the case where the oblique ion implantation is conducted to the bottom surface of the groove, the distance between the low concentration impurity layer and the high concentration impurity layer can be adjusted, and the suitable impurity concentration can be ensured in the low concentration impurity layer.

Furthermore, in the case where the surface of the groove is covered with the oxide film, the distance between the low concentration impurity layer formed immediately under the side wall spacer and the impurity layer formed on the bottom surface of the groove can be adjusted by the thickness of the oxide film. In the case where the side wall of the groove is taperd, when the ion implantation is conducted to the bottom surface of the groove in the perpendicular direction, the apparent thickness of the oxide film with respect to the implantation angle on the side wall of the groove becomes extremely larger than that on the bottom surface, and thus the impurity is selectively ion-implanted only on the bottom surface, whereby the impurity concentration of the low concentration impurity layer having been previously formed immediately under the side wall spacer can be easily maintained.

According to the still another process for producing a semiconductor memory device of the invention, in addition to the effects of the process for producing a semiconductor memory device described in the foregoing, deterioration in film quality of the tunnel oxide film can be avoided by conducting the ion implantation of the impurity after covering the side wall of the floating gate with the oxide film, so as to improve the reliability of the cell characteristics. Furthermore, since the low concentration impurity layer and the high concentration impurity layer are extended to the position under the floating gate by the thermal treatment before forming the groove, the width between the floating gates can be further reduced.

According to the semiconductor memory device of the invention, since the asymmetric impurity layer is present in the groove between the floating gates, the bit line and the source line can be shared, and the cell area can be decreased. Because the depth of the groove between the floating gates, the impurity concentration of the high concentration impurity layer on the bottom surface of the groove, and the impurity concentrations of the high concentration impurity layer and the low concentration impurity layer on the side wall of the groove can be individually controlled, modification of the cell characteristics can be easily conducted, and conformation to other processes or improvement can be easily conducted, whereby a highly reliable semiconductor memory device can be provided. Furthermore, because the wiring layer is arranged on the bottom surface of the groove by the high concentration impurity layer, the cross sectional area of the high concentration impurity layer can be increased to decrease the wiring resistance. Therefore, because the number of word lines per one block, i.e., the cell number, can be increased to reduce the total number of selected transistors arranged in the respective block, the area of the cell array can further be decreased. Consequently, the number of chips per one wafer is increased to decrease the cost per one chip, and therefore an inexpensive semiconductor memory device can be provided.

What is claimed is:

1. A semiconductor memory device comprising a plurality of memory cells comprising:
    a substrate which has at least first and second grooves formed therein and source/drain regions formed on side walls of the grooves,
    a floating gate supported by the semiconductor substrate between the grooves,
    a control gate formed over the floating gate, wherein at least one interlayer capacitive film is provided between the control gate and the floating gate,
    wherein a first memory cell which uses the floating gate comprises a source/drain region comprising a low concentration impurity layer in the first groove and a high concentration impurity layer in the second groove so that the source and drain of the first memory cell are located in different grooves, the low concentration impurity layer being formed in a side wall of the first groove and the high concentration impurity layer being formed in a side wall of the second groove,
    a second memory cell comprising a source/drain region including a high concentration impurity layer and a low concentration impurity layer located in different grooves; and
    wherein, in the first groove, the low concentration impurity layer of the soiuirce/drain region of the first memory cell is connected to the high concentration impurity layer of the second memory cell via an impurity layer formed in a bottom surface of the first groove.

2. A semiconductor memory device according to claim 1, wherein an impurity concentration of the impurity layer formed at the bottom surface of the groove is substantially equal to or higher than a concentration of the high concentration impurity layer of the first memory cell.

3. A semiconductor memory device according to claim 1, wherein the difference in concentration between the low concentration impurity layer and the high concentration impurity layer of the first memory cell is two or more digits.

4. A semiconductor memory device according to claim 1, wherein the depth of each groove is defined such that the concentration of the low concentration impurity layer of the groove is not affected by diffusion from the high concentration impurity layer arranged on the bottom surface of the groove.

5. A semiconductor memory device according to claim 1, wherein each groove is configured to have a depth and a width so that the impurity layer in the bottom surface of the groove has a resistance to serve as a diffusion wiring.

6. The device of claim 1, wherein the low concentration impurity layer and the high concentration impurity layer are formed in opposing side walls of the groove with the bottom surface of the groove extending therebetween.

7. The device of claim 1, wherein immediately adjacent memory cells share diffusion layers, wherein the first memory cell uses the high concentration impurity layer in the first groove as a source or drain region, and the second memory cell uses the low concentration impurity layer in the first groove as a source or drain region.

8. The semiconductor memory device of claim 1, wherein the high concentration impurity layer of the second memory cell is also partially provided in the botiom surface of the first groove.

9. A semiconductor memory device comprising:
   a semiconductor substrate with a groove defined in a surface thereof;
   floating gates supported by the semiconductor substrate, the groove being located so that first and second floating gates are respectively provided on opposite sides of the groove;
   a source/drain region comprising a first impurity layer of a first memory cell and a second impurity layer of a second memory cell that is adjacent to the first memory cell, the first impurity layer having a higher impurity concentration than the second impurity layer; and
   wherein the first impurity layer of the first memory cell and the second impurity layer of the second memory cell are formed in opposing sidewalls of the groove, and wherein the first and second impurity layers formed in the opposing sidewalls of the groove are connected to one another via an impurity layer formed in a bottom surface of the groove.

10. The semiconductor memory of claim 9, wherein a difference in concentration between the first and second impurity layers is two or more digits.

11. The device of claim 9, wherein the first and second memory cells are immediately adjacent and share diffusion layers, wherein the first cell uses the first impurity layer in the groove as a source or drain region, and the second cell uses the second impurity layer in the groove as a source or drain region.

12. The semiconductor memory device of claim 9, wherein the second impurity layer of the second memory cell is also partially provided in the bottom surface of the groove.

13. A semiconductor memory device comprising:
   a semiconductor substrate with a groove defined in a surface thereof;
   floating gates supported by the semiconductor substrate, the groove being located so that first and second floating gates are respectively provided at least partially on opposite sides of the groove;
   a source/drain region comprising a first impurity layer of a first memory cell and a second impurity layer of a second memory cell, the first impurity layer having a higher impurity concentration than the second impurity layer; and
   wherein the first impurity layer of the first memory cell having the higher impurity concentration and the second impurity layer of the second memory cell are formed in different sidewalls of the groove, and wherein the first impurity layer of the first memory cell and the second impurity layer of the second memory cell share a diffusion layer provided at least in a bottom surface of the groove.

14. The device of claim 13, wherein the first and second memory cells are immediately adjacent and share diffusion layers, so that the first cell uses the first impurity layer in the groove as a source or drain region, and the second cell uses the second impurity layer in the groove as a source or drain region.

* * * * *